US009666767B2

(12) United States Patent
Hirosaki et al.

(10) Patent No.: US 9,666,767 B2
(45) Date of Patent: May 30, 2017

(54) FLUOROPHORE, METHOD FOR PRODUCING SAME, LIGHT-EMITTING DEVICE USING FLUOROPHORE, IMAGE DISPLAY DEVICE, PIGMENT, AND ULTRAVIOLET ABSORBENT

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 188 days.

(21) Appl. No.: 14/416,582

(22) PCT Filed: Jul. 25, 2013

(86) PCT No.: PCT/JP2013/070243
§ 371 (c)(1),
(2) Date: Jan. 22, 2015

(87) PCT Pub. No.: WO2014/017613
PCT Pub. Date: Jan. 30, 2014

(65) Prior Publication Data
US 2015/0179899 A1     Jun. 25, 2015

(30) Foreign Application Priority Data
Jul. 25, 2012   (JP) ................. 2012-164558

(51) Int. Cl.
*H01L 33/50* (2010.01)
*C09K 11/59* (2006.01)
(Continued)

(52) U.S. Cl.
CPC ........ *H01L 33/502* (2013.01); *C09K 11/0883* (2013.01); *C09K 11/7734* (2013.01);
(Continued)

(58) Field of Classification Search
CPC .. C09K 11/7734; H01L 33/502; H01L 27/156
See application file for complete search history.

(56) References Cited

U.S. PATENT DOCUMENTS 7,794,624 B2 * 9/2010 Tamaki .............. C09K 11/0883
                                                252/301.4 F
7,951,308 B2   5/2011 Tamaki et al.
(Continued)

FOREIGN PATENT DOCUMENTS

JP   A 2005112922 A   4/2005
JP   B 3668770 B2     4/2005
(Continued)

OTHER PUBLICATIONS

Park et al, "Combinatorial chemistry of oxynitride phosphors and discovery of a novel phoshor for use in light emitting diodes, Ca1.5Ba0.5Si5N6O3:Eu2+", Journal of Materials Chemsitry C, 1, Jan. 3, 2013, pp. 1832-1839.*
(Continued)

*Primary Examiner* — Carol M Koslow
(74) *Attorney, Agent, or Firm* — Trojan Law Offices

(57) ABSTRACT

Provided is fluorophore comprising: inorganic compound having: an inorganic crystal, where M element (M is one or more elements selected from Mn, Ce, Pr, Nd, Sm, Eu, Tb, Dy, and Yb) is solid solved, having the same crystal structure as the crystal represented by $Ca_2Si_5O_3N_6$ (including $Ca_2Si_5O_3N_6$ crystal or a solid solution thereof where one or more elements selected from Mg, Sr, Ba, Ge, Sn, Ti, Zr, Hf, B, Al, Ga, In, Sc, Y, La, and F are solid solved) and comprising: A element, D element, X element, and, if necessary, E element (A is one or more elements selected from Mg, Ca, Sr, and Ba; D is one or more elements selected from Si, Ge, Sn, Ti, Zr, and Hf; E is one or more elements
(Continued)

selected from B, Al, Ga, In, Sc, Y, and La; and X is one or more elements selected from O, N, and F).

27 Claims, 8 Drawing Sheets

(51) Int. Cl.
    *C09K 11/08*     (2006.01)
    *C09K 11/64*     (2006.01)
    *C09K 11/79*     (2006.01)
    *C09K 11/80*     (2006.01)
    *C09K 11/77*     (2006.01)
    *H01J 1/63*     (2006.01)
    *H01L 25/065*     (2006.01)
    *H01L 27/15*     (2006.01)

(52) U.S. Cl.
    CPC ............ *H01J 1/63* (2013.01); *H01L 25/0655* (2013.01); *H01L 27/156* (2013.01); *H01L 33/504* (2013.01); *H01L 2224/45144* (2013.01); *H01L 2224/48091* (2013.01); *H01L 2224/48247* (2013.01); *H01L 2224/8592* (2013.01); *H01L 2924/12044* (2013.01); *H01L 2924/181* (2013.01)

(56) References Cited

U.S. PATENT DOCUMENTS

| | | |
|---|---|---|
| 2006/0124947 A1 | 6/2006 | Mueller |
| 2006/0192178 A1 | 8/2006 | Hirosaki |
| 2007/0007494 A1 | 1/2007 | Hirosaki et al. |
| 2007/0018567 A1 | 1/2007 | Hirosaki |
| 2007/0108896 A1 | 5/2007 | Hirosaki |
| 2008/0001126 A1 | 1/2008 | Hirosaki |
| 2008/0303409 A1 | 12/2008 | Hirosaki |
| 2009/0236969 A1 | 9/2009 | Hirosaki |
| 2010/0288973 A1 | 11/2010 | Tamaki et al. |
| 2011/0121234 A1 | 5/2011 | Hirosaki |

FOREIGN PATENT DOCUMENTS

| | | |
|---|---|---|
| JP | B 3837551 B2 | 8/2006 |
| JP | B 3837588 B2 | 8/2006 |
| JP | B 3921545 B2 | 3/2007 |
| JP | 2009-167328 A | 7/2009 |
| JP | B 4524368 B2 | 6/2010 |
| TW | 200419826 * | 10/2004 |
| TW | 200419826 A | 10/2004 |
| WO | WO 2004039915 A | 5/2004 |
| WO | WO 2005019376 A | 3/2005 |
| WO | WO 2006101096 A | 9/2006 |
| WO | WO 2007066733 A | 6/2007 |

OTHER PUBLICATIONS

ROC (Taiwan) Office Action of the Intellectual Property Office, Issuance Date Feb. 13, 2015.
International Search Report of Parent PCT Application from Japanese Patent Office, PCT/JP2013/070243, Nov. 5, 2013.

* cited by examiner

FLUOROPHORE, METHOD FOR PRODUCING SAME, LIGHT-EMITTING DEVICE USING FLUOROPHORE, IMAGE DISPLAY DEVICE, PIGMENT, AND ULTRAVIOLET ABSORBENT

TECHNICAL FIELD

The present invention relates to a fluorophore (phosphor), a manufacture thereof, and an application thereof, wherein the phosphor comprises: an inorganic compound comprising: a crystal represented (expressed, designated) by $A_2$ (D, $E)_5X_9$ wherein at least D of D and E is present, a crystal represented by $Ca_2Si_5O_3N_6$, an inorganic crystal having the same crystal structure as the crystal represented by $Ca_2Si_5O_3N_6$ has, or a solid solution crystal of these crystals, which includes an A element, a D element, an X element, and, if necessary, an E element (here, A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), into each of which an M element (M is one or two or more kinds of elements selected from the group consisting of Mn, Ce, Pr, Nd, Sm, Eu, Tb, Dy, and Yb) is solid-solved.

BACKGROUND ART

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a conventional phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when β-type sialon is activated by $Ce^{3+}$ (for example, refer to Patent Reference 6).

As an example of an oxynitride phosphor, a blue phosphor having a JEM phase ($LaAl(Si_{6-z}Al_z)N_{10-z}O_z$) as a host crystal, which is activated by Ce (refer to Patent Reference 7), is known. It is known that, in the phosphor, an emission wavelength may shift to a longer wavelength as an excitation wavelength shifts to a longer wavelength by substituting partially La with Ca while the crystal structure is maintained.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are improved by utilizing this phosphor. A phosphor to which Ce was added as the activating element was reported to be an orange phosphor.

Thus, an emission color of the phosphor could vary depending on a combination of a crystal thereof to act as the host crystal and a metal ion (activating ion or also referred to as light-emitting ion) being incorporated into the crystal as a solid solution. Further, emission characteristics such as an emission spectrum and an excitation spectrum, chemical stability, or thermal stability could vary depending on the combination of the host crystal and the activating ion such that a phosphor may be regarded as another different phosphor when either host crystal thereof or activating ion thereof is different. Moreover, a material having even the same chemical composition should be regarded as another different phosphor when a crystal structure thereof is different such that the host crystal is different. In this way, the material having a different crystal structure generally has different emission characteristics or stability.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO 2007/066733.
[Patent Reference 6] International Publication No. WO 2006/101096.
[Patent Reference 7] International Publication No. WO 2005/019376.
[Patent Reference 8] Japanese Patent Application Publication No. 2005-112922.
[Patent Reference 9] Japanese Patent No. 3837588, Specification.

SUMMARY OF THE INVENTION

Problem to Be Solved By the Invention

The present invention aims to satisfy such demand and it is one of the objects to provide an inorganic phosphor that has emission characteristics (emission color and excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting device that utilizes such a phosphor and is excellent in durability and an image display device that utilizes such a phosphor and is excellent in durability. Another object of the present invention is to provide a pigment and an ultraviolet absorber utilizing an inorganic compound included in the above phosphor.

Means to Solve the Problem

Under such a situation, the present inventors investigated in detail a phosphor having, as a host crystal, a new crystal containing nitrogen and a crystal in which a metal element or N in the crystal structure is substituted by another kind of element, so as to find out that an inorganic phosphor having, as the host crystal, a crystal represented by $Ca_2Si_5O_3N_6$, an inorganic crystal having the same (identical) crystal structure as the $Ca_2Si_5O_3N_6$ crystal has, or a solid solution crystal of these emitted fluorescence of high brightness. Further, it was found out that a phosphor having a specific composition exhibited the emission of blue color or yellow-to-red color.

Further, it was found to be possible to obtain a white color light-emitting diode (light-emitting device) with a high emission efficiency and a small temperature fluctuation, an illuminating device with the same diode, and an image display device rendering bright coloring by utilizing such phosphor.

Under the above-mentioned situation, the present inventors have continued such an intensive investigation as to successfully provide a phosphor exhibiting a luminescent phenomenon of high intensity in a specific wavelength range by configuring the phosphor as follows. And a phosphor having excellent emission characteristics has been successfully manufactured by the following method. Further, a light-emitting device, an illuminating device, an image display device, a pigment, and an ultraviolet absorber having excellent properties have been successfully provided by utilizing this phosphor and providing such configuration as described below.

(1) A phosphor comprising: an inorganic compound having: a crystal represented by $Ca_2Si_5O_3N_6$, an inorganic crystal having the same (identical) crystal structure as the crystal represented by $Ca_2Si_5O_3N_6$ has, or a solid solution crystal thereof, which includes an A element, a D element, an X element, and, if necessary, an E element (where A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), into each of which an M element (where M is one or two or more kinds of elements selected from the group consisting of Mn, Ce, Pr, Nd, Sm, Eu, Tb, Dy, and Yb) is solid solved. For example, a yellow phosphor (wavelength: 570-615 nm) in which the M element is Eu if the A element is a combination of Ca and Sr, a yellow phosphor in which the M element is Eu if the A element is a combination of Ca, Ba, and Sr, a yellow phosphor in which the M element is Eu if the A element is a combination of Ca and Ba and a large amount of Eu is solid solved, and so on are included.

A phosphor comprising: an inorganic compound comprising: an inorganic crystal having a same crystal structure as a crystal represented by $Ca_2Si_5O_3N_6$, which includes an A element, a D element, and an X element, and an E element if necessary (where A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), in which an M element (where M is one or two or more kinds of elements selected from the group consisting of Mn, Ce, Pr, Nd, Sm, Eu, Tb, Dy, and Yb) is solid solved, and wherein the inorganic crystal includes the crystal itself represented by $Ca_2Si_5O_3N_6$ or a solid solution thereof in which one or two or more kinds of elements selected from the group consisting of Mg, Sr, Ba, Ge, Sn, Ti, Zr, Hf, B, Al, Ga, In, Sc, Y, La, and F are solid solved.

(2) The phosphor according to the above (1), wherein the inorganic crystal having the same crystal structure as the crystal represented by $Ca_2Si_5O_3N_6$ is a crystal represented by $A_2(D,E)_5X_9$ wherein at least D of D and E is present; the A element includes at least one element selected from the group consisting of Ca, Ba, and Sr; the D element includes Si; the X element includes O and N; and the E element, if necessary, includes Al.

(3) The phosphor according to the above (1) or (2), wherein the inorganic crystal having the same crystal structure as the crystal represented by $Ca_2Si_5O_3N_6$ is represented by a composition formula: $Ca_2Si_{5-x}Al_xO_{3+x}N_{6-x}$, (Ca, Ba)$_2$Si$_{5-x}$Al$_x$O$_{3+x}$N$_{6+x}$ wherein both Ca and Ba are present, or (Ca, Sr)$_2$Si$_{5-x}$Al$_x$O$_{3+x}$N$_{6-x}$ wherein both Ca and Sr are present (where 0≤x≤4).

(4) The phosphor according to any one of the above (1) to (3), wherein the M element is Eu.

(5) The phosphor according to any one of the above (1) to (4), wherein the inorganic crystal having the same crystal structure as the crystal represented by Ca$_2$Si$_5$O$_3$N$_6$ is a monoclinic crystal.

(6) The phosphor according to any one of the above (1) to (5), wherein the inorganic crystal having the same crystal structure as the crystal represented by Ca$_2$Si$_5$O$_3$N$_6$ is a monoclinic crystal and wherein lattice constants a, b, and c have values in the following ranges:

a=0.70588±0.05 nm;
b=2.37480±0.05 nm; and
c=0.96341±0.05 nm.

Here, the symbol "±" signifies tolerance or the like. For example, with respect to 'a', the value of 'a' may be at least 0.70588-0.05 nm and not more than 0.70588+0.05 nm (the same shall apply hereafter).

(7) The phosphor according to any one of the above (1) to (6), wherein the inorganic compound is represented by a composition formula of M$_d$A$_e$D$_f$E$_g$X$_h$ comprising the M element, the A element, the D element, the E element, and the X element (where d+e+f+g+h=1 in the formula), and parameters d, e, f, g, and h satisfy the following conditions:

0.00001≤d≤0.05;
0.08≤e≤0.15;
0.2≤f≤0.4;
0≤g≤0.05; and
0.45≤h≤0.65.

(8) The phosphor according to the above (7), wherein the parameters d, e, f, g, and h satisfy the following conditions:

d+e=(2/16)±0.05;
f+g=(5/16)±0.05; and
h=(9/16)±0.05.

(9) The phosphor according to the above (7) or (8), wherein the parameters f and g satisfy the following condition:

4/5≤f/(f+g)≤5/5.

(10) The phosphor according to any one of the above (7) to (9), wherein the inorganic compound is represented by the composition formula of M$_d$A$_e$D$_f$E$_g$O$_{h1}$N$_{h2}$ (where d+e+f+g+h1+h2==1 in the formula and h1+h2=h.), and the following condition is satisfied:

2/9<h1/(h1+h2)<5/9.

(11) The phosphor according to any one of the above (7) to (10), wherein the M element comprises at least Eu.

(12) The phosphor according to any one of the above (7) to (11), wherein the A element comprises at least one element selected from the group consisting of Ca, Ba, and Sr; the D element comprises Si; the X element comprises O and N; and the E element, if necessary, comprises Al. Or it may be said that the A element comprises Ca and Ba; Ca and Sr; or Ca, Ba, and Sr. In particular, it is preferable that the A element comprises Ca and Sr.

(13) The phosphor according to any one of the above (1) to (12), wherein the inorganic compound is represented by the composition formula of:

Eu$_y$Ca$_{2-y}$Si$_{5-x}$Al$_x$O$_{3+x}$N$_{6-x}$,
Eu$_y$(Ca, Ba)$_{2-y}$Si$_{5-x}$Al$_x$O$_{3+x}$N$_{6-x}$, or
Eu$_y$(Ca, Sr)$_{2-y}$Si$_{5-x}$Al$_x$O$_{3+x}$N$_{6-x}$, where the parameters x and y satisfy:

0≤x≤4, and
0.0001≤y≤1.

(14) The phosphor according to the above (13), wherein the parameter y satisfies 0.05≤y≤0.7 and wherein yellow-to-orange fluorescence having a peak at the wavelength of at least 570 nm and not exceeding 615 nm is emitted.

(15) The phosphor according to any one of the (1) to (14), wherein the inorganic compound comprises a single crystal particle or an aggregate of single crystal particles having a mean particle diameter of at least 0.1 μm and not exceeding 20 μm.

(16) The phosphor according to any one of the above (1) to (15), wherein the sum of Fe, Co, and Ni impurity elements included in the inorganic compound does not exceed 500 ppm.

(17) The phosphor according to any one of the above (1) to (16), further comprising another crystal phase or amorphous phase that is different from the inorganic compound in addition to the inorganic compound, wherein the content amount of the inorganic compound is equal to or more than 20 mass %.

(18) The phosphor according to the above (17), wherein the other crystal phase or amorphous phase is an inorganic substance having electrical conductivity.

(19) The phosphor according to the above (18), wherein the inorganic substance having the electrical conductivity is oxide, oxynitride, nitride, or a mixture thereof, any one of which includes one or two or more kinds of elements selected from a group consisting of Zn, Al, Ga, In, and Sn.

(20) The phosphor according to the above (17) or (18), wherein the other crystal phase or amorphous phase is another inorganic phosphor that is different from the inorganic compound.

(21) The phosphor according to any one of the above (1) to (20), wherein fluorescence having a peak at the wavelength in the range from 450 nm to 615 nm is emitted upon irradiation of an excitation source.

(22) The phosphor according to the above (21), wherein the excitation source is an electron beam; an X-ray or light having a wavelength that is at least 100 nm and not exceeding 450 nm, the light being a vacuum ultraviolet ray, an ultraviolet ray, or visible light.

(23) The phosphor according to any one of the above (1) to (22), wherein the phosphor comprises the crystal represented by Ca$_2$Si$_5$O$_3$N$_6$ or the inorganic crystal having the same crystal structure as the crystal represented by Ca$_2$Si$_5$O$_3$N$_6$, in each of which Eu is solid solved, and wherein blue-to-orange fluorescence of at least 450 nm and not exceeding 615 nm is emitted upon irradiation of light from 290 nm to 500 nm.

(24) The phosphor according to any one of the above (1) to (23), wherein a color of light emitted upon irradiation of an excitation source satisfies, in terms of values of (x, y) of CIE 1931 chromaticity coordinates, conditions:

0≤x≤0.7; and
0≤y≤0.9.

(25) A method of manufacturing a phosphor recited in any one of the above (1) to (24) comprising: firing a mixture of metal compounds, which can constitute the inorganic compound recited in the above (1) by firing the mixture, in a temperature range of at least 1,200° C. and not exceeding 2,200° C. in an inert atmosphere including nitrogen.

(26) The method of manufacturing the phosphor according to the above (25), wherein the mixture of metal compounds comprises: a compound including M, a compound including A, a compound including D, and a compound including X and, if necessary, a compound including E (wherein M is one or two or more kinds of elements selected from a group consisting of Mn, Ce, Pr, Nd, Sm, Eu, Tb, Dy, and Yb; A is one or two or more kinds of elements selected from a group consisting of Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

(27) The method of manufacturing the phosphor according to the above (26), wherein the compound including M is a single kind of substance or a mixture of at least two kinds of substances selected from a group consisting of metal, silicide, oxide, carbonate, nitride, oxynitride, chloride, fluoride and oxyfluoride, each of which includes M; wherein the compound including A is a single kind of substance or a mixture of at least two kinds of substances selected from a group consisting of metal, silicide, oxide, carbonate, nitride, oxynitride, chloride, fluoride, and oxyfluoride, each of which includes A; wherein the compound including D is a single kind of substance or a mixture of at least two kinds of substances selected from a group consisting of metal, silicide, oxide, carbonate, nitride, oxynitride, chloride, fluoride, and oxyfluoride, each of which includes D; and wherein the compound including E is a single kind of substance or a mixture of at least two kinds of substances selected from a group consisting of metal, silicide, oxide, carbonate, nitride, oxynitride, chloride, fluoride, and oxyfluoride, each of which includes E.

(28) The method of manufacturing the phosphor according to any one of the above (25) to (27), wherein the mixture of metal compounds includes at least nitride or oxide of europium; nitride, oxide, or carbonate of at least one element selected from a group consisting of calcium, barium, and strontium; and silicon oxide or silicon nitride.

(29) The method of manufacturing the phosphor according to any one of the above (25) to (28), wherein the inert atmosphere including nitrogen is in a pressure range of at least 0.1 MPa and not exceeding 100 MPa; and wherein the inert atmosphere including nitrogen is a nitrogen gas atmosphere.

(30) The method of manufacturing the phosphor according to any one of the above (25) to (29), wherein graphite is used in a sample container, a heat-insulating element, or a heating element of a firing furnace.

(31) The method of manufacturing the phosphor according to any one of the above (25) to (30), wherein a form of the mixture of metal compounds is powder or aggregate, and wherein the step of firing is performed after the metal compounds are filled in a container as being maintained with a filling rate of 40% or less in a bulk density.

(32) The method of manufacturing the phosphor according to any one of the above (25) to (31), wherein the mixture of metal compounds is kept in a container made of boron nitride.

(33) The method of manufacturing the phosphor according to any one of the above (25) to (32), wherein a form of the mixture of metal compounds is powder or aggregate, wherein a mean particle diameter of the powder or aggregate is 500 μm or less.

(34) The method of manufacturing the phosphor according to the above (33), wherein a spray dryer, sieving, or pneumatic classification is utilized.

(35) The method of manufacturing the phosphor according to any one of the above (25) to (34), wherein the step of firing is performed by a pressureless sintering method or a gas-pressure sintering method.

(36) The method of manufacturing the phosphor according to any one of the above (25) to (35), wherein a mean particle diameter of phosphor powder synthesized by firing is controlled to be at least 50 nm and not exceeding 20 μm by one or more techniques selected from pulverization, classification, and acid treatment.

(37) The method of manufacturing the phosphor according to any one of the above (25) to (36), wherein a phosphor powder after firing, a phosphor powder after pulverization treatment, or a phosphor powder after controlling a particle size is heat-treated at a temperature that is equal to or higher than 1,000° C. and equal to or lower than a firing temperature.

(38) The method of manufacturing the phosphor according to any one of the above (25) to (37), wherein an inorganic compound to form a liquid phase at a temperature equal to or less than the firing temperature is added to the mixture of metal compounds, which is then fired in the firing step.

(39) The method of manufacturing the phosphor according to the above (38), wherein the inorganic compound to form the liquid phase at the temperature equal to or less than the firing temperature is a mixture of one or more kinds of substances selected from a group consisting of fluoride, chloride, iodide, bromide, and phosphate of one or two or more elements selected from a group consisting of Li, Na, K, Mg, Ca, Sr, and Ba.

(40) The method of manufacturing the phosphor according to the above (38) or (39), wherein a content amount of the inorganic compound to form the liquid phase at the temperature equal to or less than the firing temperature is reduced by washing with a solvent after the step of firing.

(41) A light-emitting device comprising at least a light-emitting body or an emission source and a phosphor (hereinafter referred to as "first phosphor"), wherein the first phosphor includes at least a phosphor recited in any one of the above (1) to (24).

(42) The light-emitting device according to the above (41), wherein the light-emitting body emits light in the wavelength of 330 to 500 nm and is selected an organic EL light-emitting body (OLED), a semiconductor laser, a laser diode (LD), or a light-emitting diode (LED).

(43) The light-emitting device according to the above (41) or (42), wherein the light-emitting device is a white light-emitting diode, an illuminating device including a plurality of white light-emitting diodes, or a backlight for a liquid crystal panel.

(44) The light-emitting device according to any one of the above (41) to (43), wherein the light-emitting body or the emission source emits ultraviolet or visible light having a peak wavelength of 280 to 500 nm, and wherein the light-emitting device emits white light or light other than the white light by mixing blue-to-orange light emitted by the phosphor recited in any one of the above (1) to (24) and light having a wavelength of 450 nm or more emitted by another phosphor.

(45) The light-emitting device according to any one of the above (41) to (44), further comprising a blue phosphor being caused to emit light having a peak wavelength of 420 nm to 500 nm or less by the light-emitting body or the emission source.

(46) The light-emitting device according to the above (45), wherein the blue phosphor is selected from a group consisting of AlN: (Eu,Si) wherein both Eu and Si are present, $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

(47) The light-emitting device according to any one of the above (41) to (46), further comprising a green phosphor being caused to emit light having a peak wavelength of at least 500 nm and not exceeding 550 nm by the light-emitting body or the emission source.

(48) The light-emitting device according to the above (47), wherein the green phosphor is selected from the group consisting of β-sialon:Eu, (Ba,Sr,Ca,Mg)$_2$SiO$_4$:Eu wherein at least one of Ba, Sr, Ca, and Mg is present, and (Ca,Sr,Ba)Si$_2$O$_2$N$_2$:Eu wherein at least one of Ca, Sr, and Ba is present.

(49) The light-emitting device according to any one of the above (41) to (48), further comprising a yellow phosphor being caused to emit light having a peak wavelength of at least 550 nm and not exceeding 600 nm by the light-emitting body or the emission source.

(50) The light-emitting device according to the above (49), wherein the yellow phosphor is selected from the group consisting of YAG:Ce, CaAlSiN$_3$:Ce, and La$_3$Si$_6$N$_{11}$:Ce.

(51) The light-emitting device according to any one of the above (41) to (50), further comprising a red phosphor being caused to emit light having a peak wavelength of at least 600 nm and not exceeding 700 nm by the light-emitting body or the emission source.

(52) The light-emitting device according to the above (51), wherein the red phosphor is selected from the group consisting of CaAlSiN$_3$:Eu, (Ca,Sr)AlSiN$_3$:Eu wherein both Ca and Sr are present, Ca$_2$Si$_5$N$_8$:Eu, and Sr$_2$Si$_5$N$_8$:Eu.

(53) The light-emitting device according to any one of the above (41) to (52), wherein the light-emitting body or the emission source is an LED for emitting light having a wavelength of 320 to 450 nm.

(54) An image display device comprising an excitation source and the first phosphor, wherein the first phosphor includes at least a phosphor recited in any one of the above (1) to (24).

(55) The image display device according to the above (54), wherein the image display device is a fluorescent display tube (VFD), a field emission display (FED), a plasma display panel (PDP), a cathode-ray tube (CRT), or a liquid crystal display (LCD).

(56) A pigment comprising an inorganic compound recited in any one of the above (1) to (24).

(57) An ultraviolet absorber comprising an inorganic compound recited in any one of the above (1) to (24).

Effect of the Invention

The phosphor according to the present invention includes an inorganic compound as the main component comprising a crystal represented by Ca$_2$Si$_5$O$_3$N$_6$, an inorganic crystal having the same crystal structure thereof, or a solid solution crystal as the host crystal, in each of which an activating element is solid solved. By configuring the phosphor as mentioned above, the phosphor exhibits emission of high brightness and the phosphor having a specific composition is excellent as a blue or yellow-to-orange phosphor. Since the brightness of the phosphor of the present invention does not decrease even when the phosphor is exposed to the excitation source, the phosphor of the present invention is suitably used for a light-emitting device such as a white light-emitting diode, an illuminating device, a backlight source for a liquid crystal, VFD, FED, PDP or CRT. Further, the phosphor of the present invention absorbs ultraviolet ray, and thus the phosphor is suitable for a pigment and ultraviolet absorber.

EMBODIMENT FOR CARRYING OUT THE INVENTION

Hereafter, a phosphor according to the present invention is described in detail with reference to the drawings.

The phosphor of the present invention includes an inorganic compound as the main component comprising a host crystal in which an M element (where M is one or two or more elements selected from the group consisting of Mn, Ce, Pr, Nd, Sm, Eu, Tb, Dy, and Yb.) is solid solved wherein the host crystal includes at least an A element, a D element, an X element, and, if necessary, an E element (where A is one or two or more elements selected from the group consisting of Mg, Ca, Sr, and Ba; D is one or two or more elements selected from the group consisting of Si, Ge, Sn, Ti, Zr, and Hf; E is one or two or more elements selected from the group consisting of B, Al, Ga, In, Sc, Y, and La; and X is one or two or more elements selected from the group consisting of O, N, and F.).

Specifically, the phosphor of the present invention includes as the main component an inorganic compound comprising the host crystal including the A element, the D element, the X element, and, if necessary, the E element as mentioned above, wherein the host crystal is a crystal represented by $Ca_2Si_5O_3N_6$, an inorganic crystal (for example, a crystal represented by $A_2(D, E)_5X_9$), wherein at least D of D and E is present, having the same crystal structure as the crystal represented by $Ca_2Si_5O_3N_6$, or a solid solution crystal of these crystals and the M element is solid solved in the host crystal such that the phosphor works as the phosphor characterized by its high brightness. The phosphor of the present invention can emit blue-to-orange fluorescence.

Here, in the present specification, the crystal represented by $Ca_2Si_5O_3N_6$, the inorganic crystal having the same crystal structure as the crystal represented by $Ca_2 Si_5O_3N_6$, or a solid solution crystal of these crystals may also be collectively referred to as "$Ca_2Si_5O_3N_6$ system crystal" for the sake of simplicity.

The crystal represented by $Ca_2Si_5O_3N_6$, which was newly synthesized and confirmed to be a new crystal through the crystal structure analysis by the present inventors, is a crystal which has not been reported prior to the present invention.

Figure 1:
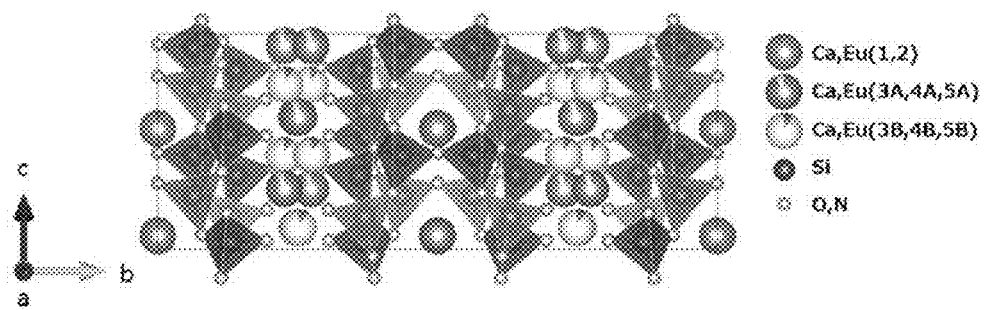
FIG. 1 is a diagram illustrating a crystal structure of Ca$_2$Si$_5$O$_3$N$_6$:Eu$^{2+}$ crystal.

FIG. 1 is a diagram showing a crystal structure of $Ca_2Si_5O_3N_6$:$Eu^{2+}$ crystal.

The present inventors synthesized $Ca_2Si_5O_3N_6$:$Eu^{2+}$ ($Ca_2Si_5O_3N_6$ crystal having solid solved $Eu^{2+}$). With respect to the synthesis procedure, detailed compositions, and so on, [Synthesis and Structure Analysis of $Ca_2Si_5O_3N_6$:$Eu^{2+}$ Crystal] to be described later should be referred to.

One of the $Ca_2Si_5O_3N_6$ crystals is $Ca_2Si_5O_3N_6$:$Eu^{2+}$ and the $Ca_2Si_5O_3N_6$:$Eu^{2+}$ belongs to the monoclinic system and the Cm space group (space group No. 8 in the International Tables for Crystallography) according to the single crystal structure analysis performed with respect to the $Ca_2Si_5O_3N_6$:$Eu^{2+}$ crystal, and is characterized by crystal parameters and atomic coordinate positions as shown in Table 1 such that respective constituting elements have respective occupancy rates at their respective sites.

In Table 1, lattice constants a, b, and c signify respective lengths of the axes of the unit cell, and $\alpha$, $\beta$, and $\gamma$ signify respective angles between axes of the unit cell. The atomic coordinates indicate a position of each atom in the unit cell in terms of a value between 0 and 1 using the unit cell as a unit. The analysis results that respective elements of Eu, Ca, Si, N, and O existed in this crystal and that Eu occupied two kinds of sites (Ca, Eu(1) to Ca, Eu(2)) were obtained. The analysis result that Ca existed in eight (8) kinds of sites (Ca, Eu(1) to Ca, Eu(2); Ca(3A) and Ca(3B); Ca(4A) and Ca (4B); Ca(5A) and Ca(5B)) was obtained. Further, the analysis result that Si existed in ten (10) kinds of sites (Si(1) to Si(10)) was obtained. Also, the analysis result that O or N existed in twenty(20) kinds of sites (O, N(1) to O, N(20)) was obtained.

TABLE 1

Crystal structure data of $Ca_2Si_5O_3N_6$: Eu crystal

| Crystal composition | $Ca_2Si_5O_3N_6$: $Eu^{2+}$ | |
|---|---|---|
| Formula weight (Z) | 4 | |
| Crystal system | Monoclinic | |
| Space group | Cm | |
| Space group number | 8 | |
| Lattice constants | a | 7.0588 Å |
| | b | 23.748 Å |
| | c | 9.6341 Å |
| | $\alpha$ | 90 degree |
| | $\beta$ | 109.038 degree |
| | $\gamma$ | 90 degree |

TABLE 1-continued

Crystal structure data of $Ca_2Si_5O_3N_6$: Eu crystal

| Atom | Atomic coordinate | | | Site occupancy rate |
|---|---|---|---|---|
| | x | y | z | |
| Ca, Eu (1) | 0.0735 | 1 | 0.0602 | 1 |
| Ca, Eu (2) | 1.0836 | 1 | 0.5599 | 1 |
| Ca (3A) | −0.4138 | 1.2523 | −0.3879 | 0.93 |
| Ca (3B) | −0.2656 | 1.2272 | −0.2361 | 0.07 |
| Ca (4A) | 0.7423 | 1.2261 | 0.2769 | 0.937 |
| Ca (4B) | 0.5758 | 1.2518 | 0.0979 | 0.063 |
| Ca (5A) | 0.4305 | 1.2258 | −0.0548 | 0.926 |
| Ca (5B) | −0.5757 | 1.2253 | −0.5652 | 0.074 |
| Si (1) | 0.714 | 1.0638 | 0.747 | 1 |
| Si (2) | −0.1534 | 1.1306 | 0.03 | 1 |
| Si (3) | 0.3262 | 1.1308 | 0.1473 | 1 |
| Si (4) | 0.3244 | 1.1278 | 0.6486 | 1 |
| Si (5) | −0.1533 | 1.1285 | −0.4724 | 1 |
| Si (6) | 0.7129 | 1.0636 | 0.2452 | 1 |
| Si (7) | 0.4584 | 1.0634 | −0.066 | 1 |
| Si (8) | 0.0905 | 1.1404 | 0.3405 | 1 |
| Si (9) | 0.0826 | 1.1399 | −0.1651 | 1 |
| Si (10) | 0.4588 | 1.0638 | 0.4318 | 1 |
| O, N (1) | 0.805 | 1 | 0.3043 | 1 |
| O, N (2) | 0.3651 | 1 | −0.0493 | 1 |
| O, N (3) | 0.6917 | 1.0792 | 0.5641 | 1 |
| O, N (4) | 0.3664 | 1 | 0.4448 | 1 |
| O, N (5) | 0.4763 | 1.0801 | 0.2604 | 1 |
| O, N (6) | 0.4761 | 1.0778 | −0.2393 | 1 |
| O, N (7) | 0.871 | 1.1141 | 0.3579 | 1 |
| O, N (8) | −0.1267 | 1.1132 | −0.1368 | 1 |
| O, N (9) | 0.6937 | 1.0787 | 0.0639 | 1 |
| O, N (10) | 0.298 | 1.1128 | 0.4688 | 1 |
| O, N (11) | 0.8083 | 1 | 0.8032 | 1 |
| O, N (12) | 0.0869 | 1.1228 | 0.1647 | 1 |
| O, N (13) | 0.0832 | 1.1185 | 0.6628 | 1 |
| O, N (14) | 0.3001 | 1.1158 | −0.0352 | 1 |
| O, N (15) | −0.2341 | 1.1943 | 0.0386 | 1 |
| O, N (16) | 0.0862 | 1.2076 | 0.3734 | 1 |
| O, N (17) | −0.2175 | 1.1937 | −0.4739 | 1 |
| O, N (18) | 0.0869 | 1.2078 | −0.1536 | 1 |
| O, N (19) | 0.4062 | 1.195 | 0.1813 | 1 |
| O, N (20) | 0.3912 | 1.1923 | −0.305 | 1 |

As a result of analysis using data in Table 1, the $Ca_2Si_5O_3N_6$:$Eu^{2+}$ crystal was found to have the structure as shown in FIG. 1, in which Ca element was included in a skeleton formed by linking tetrahedrons constituted of bonds of Si with O or N. The M element to become an activating ion such as Eu and so on was incorporated into the crystal whereby Ca element is partially substituted.

As an inorganic crystal having the same crystal structure as the $Ca_2Si_5O_3N_6$:$Eu^{2+}$ crystal, which was synthesized and subjected to the structure analysis, $A_2 (D,E)_5X_9$ crystal wherein at least D of D and E is present, $A_2Si_5O_3N_6$ crystal, and $A_2 (Si,Al)_5(O,N)_9$ crystal wherein both Si and Al and both O and N are present in the respective parentheses may be included. The A element may typically be Ca, a mixture of Ca and Ba, a mixture of Ca and Sr, or a mixture of Ca, Ba, and Sr.

With respect to the $A_2(D, F)_5X_9$ crystal, A can occupy a site which Ca is supposed to occupy, D and E can occupy a site which Si is supposed to occupy, and X can occupy a site which O and N are supposed to occupy in the crystal structure identical to that of the $Ca_2Si_5O_3N_6$ crystal. In this way, the atomic ratios of two (2) of the A element, five (5) of the sum of the D and E elements, and nine (9) of the sum of the X element can be achieved. However, it is desirable to have a ratio of cation such as A, D, and E to anion such as X satisfying an electrical neutrality condition in the crystal.

With respect to the $A_2(Si, Al)_5(O, N)_9$ crystal, Si and Al can occupy a site which Si is supposed to occupy and O and N can occupy a site which N is supposed to occupy in the same crystal structure as the $Ca_2Si_5O_3N_6$ crystal. In this way, the atomic ratios of two (2) of the A element, five (5) of the sum of Si and Al, and nine (9) of the sum of O and N can be achieved. Here, it is desirable to have a ratio of Si/Al and a ratio of O/N so as to satisfy a condition of the electrical neutrality in the crystal.

The $Ca_2Si_5O_3N_6$ system crystal of the present invention can be identified by means of the X-ray diffraction or the neutron diffraction. A substance exhibiting the identical diffraction to that of the $Ca_2Si_5O_3N_6$ crystal as a result of the X-ray diffraction in the present invention includes a crystal represented by $A_2(D, E)_5X_9$ wherein at least D of D and E is present. Further, there may be a crystal in which lattice constants or atomic positions are changed by substituting other elements for constituent elements in the crystal structure identical to that of the $Ca_2Si_5O_3N_6$ crystal.

Here, specific examples of materials in which the constituent elements are substituted with other elements may include a material in which Ca in the $Ca_2Si_5O_3N_6$ crystal is partially or completely substituted with the A element other than Ca (where A is one or two or more kinds of elements selected from Mg, Ca, Sr, and Ba) or the M element (where M is one or two or more kinds of elements selected from Mn, Ce, Pr, Nd, Sm, Eu, Tb, Dy, and Yb). Further, the specific examples may include a material in which Si in the crystal is partially or completely substituted with the D element other than Si (where D is one or two or more kinds of elements selected from Si, Ge, Sn, Ti, Zr, and Hf). A material in which O and N in the crystal is partially or completely substituted with O, N, or fluorine may be included.

It is desirable that these substitutions are performed such that the neutrality of charges in the whole crystal is maintained. The $Ca_2Si_5O_3N_6$ system crystal may include a material in which a crystal structure thereof is not changed as a result of such element substitutions. Since emission characteristics, chemical stability, and thermal stability of the phosphor are changed by the substitution of elements, the substitution of elements can be selectively utilized at an appropriate time for each application thereof as far as the crystal structure remains the same.

In the $Ca_2Si_5O_3N_6$ system crystal, the lattice constants change as the constituent components are substituted with other elements or as an activating element such as Eu is solid-solved therein, but the crystal structure, and the atomic positions given by sites to be occupied by atoms and coordinates thereof do not significantly change to an extent in which a chemical bond between skeleton atoms is broken. In the present invention, a crystal structure is defined to be identical to that of $Ca_2Si_5O_3N_6$ crystal if lengths of chemical bonds (distance of neighboring atoms) of Si—N calculated from the lattice constants and atomic coordinates obtained by conducting Rietveld analysis of the results from the X-ray diffraction or the neutron diffraction in the space group of Cm are compared with lengths of chemical bonds calculated from the lattice constants and atomic coordinates of $Ca_2Si_5O_3N_6$ crystal as shown in Table 1 such that the difference between corresponding lengths is within ±5%, and using such definition it is determined whether the crystal having the crystal structure belongs to the $Ca_2Si_5O_3N_6$ system crystal or not. This determination criterion is employed herein since it was once observed that a crystal in the $Ca_2Si_5O_3N_6$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Ca2Si_5O_3N_6$ system crystal or not is described as follows. A new substance can be identified to have the same (identical) crystal structure if main peaks of the resultant X-ray diffraction pattern measured with the new substance and the lattice constants calculated from the resultant X-ray diffraction pattern agree with the peak positions (2θ) of the diffraction pattern and the lattice constants calculated using the crystal structure data of Table 1.

Figure 2:
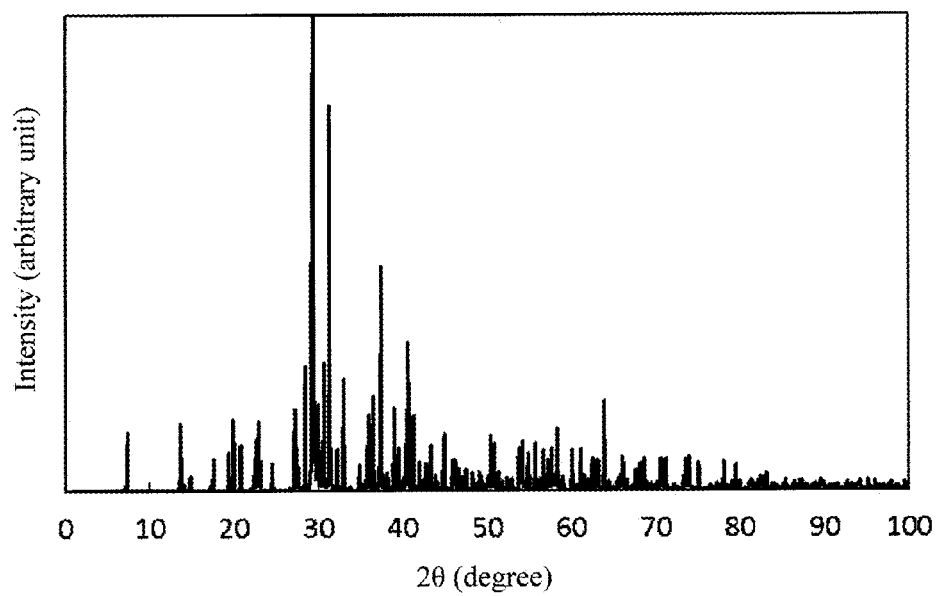
FIG. 2 is a diagram showing a powder X-ray diffraction pattern using Cu Kα-line, calculated from a crystal structure of Ca$_2$Si$_5$O$_3$N$_6$:Eu$^{2+}$ crystal.

FIG. 2 is a diagram showing a powder X-ray diffraction pattern using Cu Kα-line calculated from the crystal structure of the $Ca_2Si_5O_3N_6:Eu^{2+}$ crystal.

Since synthesized compound through an actual synthesis is obtained in a powder state, the powder X-ray diffraction patterns of the thus-obtained synthesized compound are compared to the powder X-ray diffraction patterns of FIG. 2 and it can be determined whether the synthesized compound of the $Ca_2Si_5O_3N_6$ crystal is obtained or not.

The identification may be conducted with approximately ten (10) peaks (depending on conditions, the number of peaks may include 3, 4, 5, 6, 7, 8, 9, 10, 11, 12, or more) which have high intensity of diffraction as the main peaks of the powder X-ray diffraction pattern of the $Ca_2Si_5O_3N_6$ system crystal. Table 1 is important in this sense since it could be referenced when the identification of the $Ca_2Si_5O_3N_6$ system crystal is conducted. Further, it is also possible to define a crystal structure of the $Ca_2Si_5O_3N_6$ system crystal as an approximate structure using another crystal system of the monoclinic crystal and, in such a case, the crystal structure is expressed using a different space group, different lattice constants, and different plane indices, but the X-ray diffraction pattern (for example, FIG. 2) and the crystal structure (for example, FIG. 1) remain unchanged. Therefore, even if an identification method using the other crystal system is employed, an identification result thereof should be inherently the same. Therefore, in the present invention, it is to perform an X-ray diffraction analysis using the monoclinic system. The method of identifying the substance based on Table 1 will be concretely described later, and the explanation of the method described herein is just in general.

A phosphor can be obtained by activating the $Ca_2Si_5O_3N_6$ system crystal with one or two or more elements selected from the group consisting of Mn, Ce, Pr, Nd, Sm, Eu, Tb, Dy, Tm, and Yb as an M. element. Since emission characteristics such as an excitation wavelength, an emission wavelength, and emission intensity may vary depending on the composition of the $Ca_2Si_5O_3N_6$ system crystal, and the kind and quantity of the activating element, such conditions may be selected in accordance with an application thereof. For example, a phosphor including an inorganic compound comprising a $Ca_2Si_5O_3N_6$ system crystal in which Eu is solid solved as the M element emits blue-to-orange fluorescence.

Specifically, while the A element is Ca, a mixture of Ca and Sr, or a mixture of Ca, Ba, and Sr; the D element is Si; the X element is a mixture of N and O; and the E element is Al if necessary, an inorganic compound comprising the $Ca_2Si_5O_3N_6$ system crystal in which Eu is solid solved as the M element is to become a phosphor to emit yellow-to-orange fluorescence having a peak in the wavelength range of at least 570 nm and not exceeding 615 nm (hereinafter, the phosphor that emits yellow-to-orange fluorescence having a peak in the wavelength range of at least 570 nm and not exceeding 615 nm is simply called "yellow phosphor").

While the A element is a mixture of Ca and Ba; the D element is Si; the X element is a mixture of N and O; and the E element is Al if necessary, an inorganic compound comprising the $Ca_2Si_5O_3N_6$ system crystal in which Eu is solid solved as the M element is to become a phosphor to emit blue fluorescence having a peak in the wavelength range of at least 450 nm and not exceeding 490 nm (hereinafter, the phosphor that emits blue fluorescence having a peak in the wavelength range of at least 450 nm and not exceeding 490 nm is simply called "blue phosphor"), or a yellow phosphor, depending on the amount of solid solution of Eu.

With respect to a crystal represented by $A_2(D,E)_5X_9$, if the crystal has a composition in which, at least, the A element includes at least one selected from the group consisting of Ca, Ba, and Sr; the D element includes Si, the E element, if necessary, includes Al, and the X element includes O and N, then the crystal exhibits high emission intensity. In particular, it is a phosphor having $Ca_2(Si,Al)_5(O,N)_9$ crystal wherein both Si and Al, and both O and N are present in the respective parentheses, $(Ca,Ba)_2(Si,Al)_5(O,N)_9$ crystal wherein both Ca and Ba, both Si and Al, and both O and N are present in the respective parentheses, $(Ca,Sr)_2(Si,Al)_5(O,N)_9$ crystal wherein both Ca and Sr, both Si and Al, and both O and N are present in the respective parentheses, or $(Ca,Ba,Sr)_2(Si,Al)_5(O,N)_9$ crystal wherein at least one of Ca, Ba and Sr is present, and both Si and Al and both O and N are present in the respective parentheses as the host crystal that exhibits high intensity while the A element is Ca, a mixture of Ca and Ba, a mixture of Ca and Sr, or a mixture of Ca, Ba, and Sr; the D element is Si; the E element is Al; and the X element is a combination of N and O.

It is a phosphor comprising, as the host crystal, an inorganic crystal having the crystal structure identical to that of the crystal represented by $Ca_2Si_5O_3N_6$ that exhibits high intensity and a variation of color tone to be controlled by changing a composition thereof while the inorganic crystal is a crystal represented by a composition formula of: $Ca_2Si_{5-x}Al_xO_{3+x}N_{6-x}$, $(Ca,Ba)_2Si_{5-x}Al_xO_{3+x}N_{6-x}$ wherein both Ca and Ba are present, $(Ca,Sr)_2Si_{5-x}Al_xO_{3+x}N_{6-x}$ wherein both Ca and Sr are present, or $(Ca,Ba,Sr)_2Si_{5-x}Al_xO_{3+x}N_{6-x}$ wherein at least one of Ca, Ba and Sr is present (where $0 \leq x \leq 4$). It is preferable that x satisfies $0 \leq x \leq 1$ because the emission intensity can be increased.

It is Eu that is used as the activating M element such that a phosphor exhibiting particularly high emission intensity can be obtained.

It is an inorganic compound comprising the above-mentioned inorganic crystal, in which Eu is solid solved as the activating M element, that may be represented, using parameters x and y, by:
$Eu_yCa_{2-y}Si_{5-x}Al_xO_{3+x}N_{6-x}$,
$Eu_y(Ca,Ba)_{2-y}Si_{5-x}Al_xO_{3+x}N_{6-x}$ wherein both Ca and Ba are present,
$Eu_y(Ca,Sr)_{2-y}Si_{5-x}Al_xO_{3+x}N_{6-x}$ wherein both Ca and Sr are present, or
$Eu_y(Ca,Ba,Sr)_{2-y}Si_{5-x}Al_xO_{3+x}N_{6-x}$, wherein at least one of Ca, Ba and Sr is present, where
$0 \leq x \leq 4$ and
$0.0001 \leq y \leq 1$
such that a ratio of Eu/Ca, a ratio of Eu/(Ca+Ba), a ratio of Eu/(Ca+Sr), a ratio of Eu/(Ca+Ba+Sr), a ratio of Si/Al, and a ratio of N/O can be changed in the composition range by changing the parameters x and y while a stable crystal structure thereof is kept. Thus, it is a phosphor that allows easy material design since an excitation wavelength thereof or an emission wavelength thereof can be continuously changed by utilizing this feature. For example, with respect to $Eu_y(Ca,Ba)_{2-y}Si_{5-x}Al_xO_{3+x}N_{6-x}$ wherein both Ca and Ba are present, if y is at least 0.1, the excitation spectrum could shift to the long-wavelength side such that a yellow phosphor with blue light excitation can be obtained. In this way, the peak wavelength of the excitation spectrum could be at least 400 nm or not exceeding 440 nm.

In the above-mentioned composition formula, x preferably satisfies $0 \leq x \leq 1$. Thus, the emission intensity can be increased.

In the above-mentioned composition formula, x preferably satisfies $0.05 \leq y \leq 0.7$. Thus, a yellow phosphor can be obtained. More preferably, y satisfies $0.05 \leq y \leq 0.5$. Thus, a yellow phosphor that emits light of high brightness can be obtained.

With respect to the $Eu_y(Ca, Ba)_{2-y}Si_{5-x}Al_xO_{3+x}N_{6-x}$ among the above-mentioned composition formulae, y preferably satisfies $0.1 \leq y \leq 0.5$. In this way, the peak wavelength of the excitation spectrum becomes at least 400 nm such that a yellow phosphor with excitation by visible light such as a blue LED can be obtained. That is, if y become equal to or more than 0.1, the excitation spectrum shifts to the long-wavelength side such that the phosphor can become a yellow phosphor that emits light of high brightness with an excitation source of visible light having the wavelength of at least 400 nm.

In the above-mentioned composition formula, y preferably satisfies $0.002 \leq y \leq 0.015$. In this way, a blue phosphor can be obtained.

If the inorganic crystal having the same crystal structure as the crystal represented by $Ca_2Si_5O_3N_6$ is a crystal in the monoclinic crystal system, the crystal is particularly stable and the phosphor having this crystal as the host crystal exhibits high emission intensity.

The inorganic crystal having the same crystal structure as the crystal represented by $Ca_2Si_5O_3N_6$ is a crystal in the monoclinic crystal system and has the symmetry of the space group of Cm, wherein the lattice constants a, b, and c thereof are in the following ranges:
a=0.70588±0.05 nm;
b=2.37480±0.05 nm; and
c=0.96341±0.05 nm,
such that the crystal is particularly stable and that the phosphor having the crystal as the host crystal exhibits high emission intensity. If a crystal is prepared out of the above range, the crystal may become unstable and the emission intensity thereof may occasionally decrease.

If the above-mentioned inorganic compound is represented by a composition formula of $M_dA_eD_fE_gX_h$ comprising the M element, the A element, the D element, the E element, and the X element as mentioned above (where d+e+f+g+h=1 in the formula), and parameters d, e, f, g, and h thereof satisfy all the following conditions:
$0.00001 \leq d \leq 0.05$;
$0.08 \leq e \leq 0.15$;
$0.2 \leq f \leq 0.4$;
$0 \leq g \leq 0.05$; and
$0.45 \leq h \leq 0.65$,
the phosphor comprising the inorganic compound exhibits particularly high emission intensity.

The parameter d represents an additive amount of the activating element, and if the amount is less than 0.00001, an amount of light-emitting ions is insufficient so as to cause brightness to decrease. If the amount is more than 0.05, the emission intensity may be decreased due to the concentration quenching by a mutual interaction between light-emitting ions. The parameter e is a parameter representing a constituent amount of the A element such as Ca, and if the amount is less than 0.08 or more than 0.15, the crystal structure becomes unstable so as to cause the emission intensity to decrease. The parameter f is a parameter representing a constituent amount of the D element such as Si, and if the amount is less than 0.2 or more than 0.4, the crystal structure becomes unstable so as to cause the emission intensity to decrease. The parameter g is a parameter representing a constituent amount of the E element such as Al, and if the amount is more than 0.05, the crystal structure becomes unstable so as to cause the emission intensity to decrease. The parameter h is a parameter representing a constituent amount of the X element such as O, N, and F, and if the amount is less than 0.45 or more than 0.65, the crystal structure becomes unstable so as to cause the emission intensity to decrease. The element X is an anion, and the relative composition of the X element is determined in order to maintain the charge neutrality with cations of the A, M, D and E elements.

Further, the inorganic compound having the parameters d, e, f, g, and h satisfying all the following conditions:
d+e=(2/16)±0.05;
f+g=(5/16)±0.05; and
h=(9/16)±0.05,
is characterized in that a crystal structure thereof is stable and that the emission intensity thereof is high. The inorganic compound having the parameters d, e, f, g, and h satisfying all the following conditions:
d+e=(2/16);
f+g=(5/16); and
h=(9/16), that is, the crystal having the composition of (M, A)$_2$ (D, E)$_5$X$_9$ is characterized in that a crystal structure thereof is particularly stable and that the emission intensity thereof is high.

Further, if the parameters f and g satisfy the condition of 4/5≤f/(f+g)≤1,
the inorganic compound having the parameters is characterized in that a crystal structure thereof is stable and the emission intensity is high.

In the above-mentioned composition formula, if the X element includes N and O and the inorganic compound is represented by the composition formula of M$_d$A$_e$D$_f$E$_g$O$_{h1}$N$_{h2}$ (where d+e+f+g+h1+h2=1 and h1+h2=h in the formula) and satisfies the condition of
2/9<h1/(h1+h2)<5/9,
a crystal structure thereof is stable and the emission intensity is high.

In the above-mentioned composition formulae, a phosphor in which the M element as the activating element includes at least Eu is a phosphor exhibiting high emission intensity among the present invention, a blue phosphor or a yellow phosphor can be obtained if the phosphor has a specific composition. In particular, if the A element is only Ca, a combination of Ca and Sr, or a combination of Ca, Sr, and Ba, and the M element is Eu, a yellow phosphor can be obtained. Further, in the case where the A element is a combination of Ca and Ba and the M element is Eu, a yellow phosphor that emits light of high intensity upon excitation by visible light of at least 400 nm can be obtained if the amount of solid solution of Eu is large in the composition thereof.

For example, the inorganic compound in which the M element is Eu and the parameter d satisfies 0.003≤d≤0.04 becomes a yellow phosphor that emits yellow-to-orange fluorescence having a peak at the wavelength of at least 570 nm and not exceeding 615 nm. More preferably, the inorganic compound in which the parameter d satisfies d 0.035 becomes a yellow phosphor that emits light of high brightness.

For example, the inorganic compound in which the M element is Eu, the A element is a combination of Ca and Ba, and the parameter d satisfies 0.006≤d≤0.035 becomes a yellow phosphor that emits light of high brightness upon excitation by visible light having the wavelength of at least 400 nm. Further, the inorganic compound can satisfy 0.00625≤d≤0.03125.

For example, the inorganic compound in which the M element is Eu, the A element is a combination of Ca and Ba, and the parameter d satisfies 0.0001≤d≤0.001 emits blue fluorescence having a peak at the wavelength of at least 450 nm and not exceeding 490 nm.

In the above-mentioned composition formulae, the inorganic compound in which the A element includes at least one selected from the group consisting of Ca, Ba, and Sr; the D element includes at least Si; and the X element includes at least O and N has a stable crystal structure and exhibits high emission intensity. Further, the inorganic compound in which the E element includes Al in particular exhibits high emission intensity.

A phosphor including an inorganic compound which comprises single crystal particles or an aggregate of the single crystals having a mean particle diameter of 0.1 μm or more and 20 μm or less has high emission efficiency and a good handling property when it is implemented into an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, a phosphor of the present invention comprises a mixture of an inorganic compound including, as the host crystal, the above Ca$_2$Si$_5$O$_3$N$_6$ system crystal into which the activating ion M is solid-solved and an amorphous phase or another crystal phase other than this crystal wherein a content amount of the inorganic compound of the phosphor is 20 mass % or more. In the case where a single body of the phosphor of the Ca$_2$Si$_5$O$_3$N$_6$ system crystal cannot achieve a target property or a feature such as electrical conductivity is added thereto, the present embodiment may be adapted. The content amount of the Ca$_2$Si$_5$O$_3$N$_6$ system crystal may be adjusted in accordance with the target characteristics, but the emission intensity of the phosphor may be lowered if the content amount is less than 20 mass %. It is preferable to have at least such mass % of substance as the main component of the above-mentioned inorganic compound.

In the case where the phosphor is required to have electrical conductivity in an application in which electron beam excitation or the like is employed, an inorganic substance having electrical conductivity may be added thereto as another crystal phase or an amorphous phase.

The inorganic substance having the electrical conductivity comprises: oxide, oxynitride, nitride, or a mixture of these, each of which includes one or two or more kinds of elements selected from Zn, Al, Ga, In, and Sn. In concrete, the inorganic substance may comprise zinc oxide, aluminum nitride, indium nitride, tin oxide, and so on.

In the case where a target emission spectrum cannot be achieved with a single phosphor of the Ca$_2$Si$_5$O$_3$N$_6$ system crystal, a second phosphor other than the phosphor of the $Ca_2Si_5O_3N_6$ system crystal may be added. The other phosphor comprises a BAM phosphor, a β-sialon phosphor, an α-sialon phosphor, a $(Sr, Ba)_2Si_5N_8$ phosphor, a $CaAlSiN_3$ phosphor, a $(Ca, Sr)AlSiN_3$ phosphor, and so on. Here, as the other crystal phase or the amorphous phase, an inorganic phosphor other than the inorganic compound of the present invention as described above may be used.

As one of the embodiments of the present invention, there is a phosphor having a peak at a wavelength in the range of 450 nm to 615 nm by irradiation of an excitation source. For example, a phosphor of the $Ca_2Si_5O_3N_6$ system crystal in which Eu is activated has an emission peak in this range by adjusting the composition.

As one of the embodiments of the present invention, there is a phosphor emitting light with, as an excitation source, an electron beam; an X-ray or light having a wavelength of 100 nm or more to 450 nm or less, such as vacuum ultraviolet light, ultraviolet light, and visible light. The phosphor can be made to emit light efficiently by using such excitation sources.

As one of the embodiments of the present invention, there is a phosphor including an inorganic compound comprising a crystal represented by $Ca_2Si_5O_3N_6$ or an inorganic crystal having the same crystal structure as the crystal represented by $Ca_2Si_5O_3N_6$, in each of which Eu is solid solved. Since the phosphor emits blue-to-orange fluorescence of at least 450 nm and not exceeding 615 nm by adjusting the composition upon irraditation of light from 290 nm to 500 nm, the phosphor is desiable for use in blue-to-orange emission application such as white color LED.

As one of the embodiments of the present invention, there is a phosphor, upon irradiation of the excitation source, to emit light of a specific color which satisfies, in terms of values of (x, y) of CIE 1931 chromaticity coordinates, conditions:
$0 \leq x \leq 0.7$; and
$0 \leq y \leq 0.9$.
For example, a phosphor to emit light of color in this range of the chromaticity coordinates can be obtained by adjusting a composition thereof so as to satisfy
$Eu_yCa_{2-y}Si_{5-x}Al_xO_{3+x}N_{6-x}$,
$Eu_y(Ca, Ba)_{2-y}Si_{5-x}Al_xO_{3+x}N_{6-x}$ wherein both Ca and Ba are present,
$Eu_y(Ca, Sr)_{2-y}Si_{5-x}Al_xO_{3+x}N_{6-x}$ wherein both Ca and Sr are present, or
$Eu_y(Ca, Ba, Sr)_{2-y}Si_{5-x}Al_xO_{3+x}N_{6-x}$, wherein at least one of Ca, Ba and Sr is present, where
$0 \leq x \leq 4$ and
$0.0001 \leq y \leq 1$.
The phosphor is desirable for use in blue-to-orange emission application such as white color LED.

As mentioned above, the phosphor of the present invention is characterized in that a wide range of excitation source such as electron beam, X-ray, and light from ultraviolet to visible light are applicable; that blue-to-orange color light of at least 450 nm and not exceeding 615 nm is emitted with a specific composition thereof; and that the emission wavelength and the emission peak width can be adjusted. Thus, the phosphor of the present invention is suitable for an illuminating device, an image display device, pigment, and an ultraviolet absorber because of such emission characteristics. The phosphor of the present invention has advantages of excellent heat resistance since it does not degrade even if it is exposed to high temperature, and excellent long-term stability under an oxidizing atmosphere and a moisture environment, and thus a product having excellent durability can be provided by utilizing the phosphor.

Although the method of manufacturing such a phosphor of the present invention is not particularly limited thereto, for example, such a phosphor can be obtained by firing a mixture of metal compounds that can constitute an inorganic compound having the $Ca_2Si_5O_3N_6$ system crystal as the host crystal, into which the activating ion M is solid-solved through firing, in a nitrogen-containing inert atmosphere in the temperature range of 1,200° C. or higher and 2,200° C. or lower. While the main crystal of the present invention belongs to the monoclinic crystal system and the space group Cm, another crystal that belongs to a different crystal system and a different space group from the above may be occasionally mixed therein depending on synthesis conditions such as firing temperature. However, even in such a case, it can be used as a phosphor of high emission intensity because the emission characteristics change only slightly.

As a starting material, for example, a mixture of metal compounds, which comprises a compound including M, a compound including A, a compound including D, a compound including X, and, if necessary, a compound including E (where M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F), may be satisfactorily used.

As the starting material, the compound including M that is a single kind of substance or a mixture of at least two kinds of substances selected from the group consisting of metal, silicide, oxide, carbonate, nitride, oxynitride, chloride, fluoride and oxyfluoride, each of which includes M; the compound including A that is a single kind of substance or a mixture of at least two kinds of substances selected from the group consisting of metal, silicide, oxide, carbonate, nitride, oxynitride, chloride, fluoride, and oxyfluoride, each of which includes A; the compound including D that is a single kind of substance or a mixture of at least two kinds of substances selected from the group consisting of metal, silicide, oxide, carbonate, nitride, oxynitride, chloride, fluoride, and oxyfluoride, each of which includes D; and the compound including E that is a single kind of substance or a mixture of at least two kinds of substances selected from the group consisting of metal, silicide, oxide, carbonate, nitride, oxynitride, chloride, fluoride, and oxyfluoride, each of which includes E are desiable because they are easily available and have excellent stability. The material comprising the compound including X that is a single substance or a mixture of at least two kinds of substances selected from the group consisting of oxide, nitride, oxynitride, fluoride, and oxyfluoride is desirable because the raw material is easily available and has excellent stability.

In the case where a phosphor of the $Ca_2Si_5O_3N_6$ crystal system activated by Eu is manufactured, it is preferable to use a starting material comprising, at least, nitride or oxide of europium; nitride, oxide, or carbonate of at least one element selectred from the group of calcium, strontium, and barium; and silicon oxide or silicon nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as the furnace for firing.

The pressure range of the nitrogen-containing inert atmosphere is preferably in the range of at least 0.1 MPa and not exceeding 100 MPa because thermal decomposition of nitride or oxynitride of the starting material or the product is suppressed. The nitrogen-containing inert atmosphere is preferably a nitrogen gas atmosphere. It is preferable that the oxygen partial pressure is 0.0001% or less in the firing atmosphere in order to suppress the oxidation reaction of nitride or oxynitride of the starting material or the product.

Here, the firing time is, although it differs depending on the firing temperature, usually 1 to 10 hours or so.

In order to manufacture the phosphor in the form of powder or aggregate, it is preferable to utilize a method of firing a mixture of metal compounds in a powder form or an aggregate form after the mixture is filled in a container with a filling rate kept at the bulk density of 40% or lower. It is possible to prevent particles from adhering strongly with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material. Unless otherwise noted, the relative bulk density is referred to as simply the bulk density.

Various kinds of heat-resistant materials can be used for the container containing the mixture in firing the mixture of metal compounds. However, in view of a low adverse effect of material deterioration on the metal nitride used in the present invention, a container made of boron nitride material such as sintered boron nitride body or a boron nitride coated container, which is exemplified by a boron nitride coated graphite crucible used for synthesis of an α-sialon as described in a scientific journal of "Journal of the American Ceramic Society" Vol. 85, No. 5, pages 1229 to 1234 in 2002. When the firing is performed under such conditions, boron or boron nitride component is mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor in the form of powder or aggregate, the mixture of metal compounds is in a powder form or an aggregate form and it is preferable to make the mean particle diameter of these equal to or less than 500 μm since the mixture has excellent reactivity and handling characteristics.

As a method of adjusting a particle size of the particle or aggregate to be 500 μm or less, it is preferable to employ a spray dryer, sieving, or pneumatic classification since such a method has excellent operating efficiency and handling characteristics.

In order to manufacture a phosphor in a powder form or an aggregate form, it is preferable to employ a method of firing in which no external mechanical pressing is applied such as a pressureless sintering method, a gas pressure sintering method and the like, but not a hot-pressing method.

A mean particle diameter of phosphor powder is preferably 50 nm or more and 200 μm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be at least 50 nm and not exceeding 200 μm by applying at least one technique selected from pulverization, classification, and acid treatment.

A defect included in powder and a damage caused by pulverization may be occasionally cured by heat-treating a phosphor powder after firing, a phosphor powder after pulverizing treatment, or a phosphor powder after adjusting a particle size at a temperature of at least 1,000° C. and not exceeding the firing temperature. The defect or damage may occasionally cause a decrease in the emission intensity, but the emission intensity recovers by the heat treatment.

In the case of firing for synthesis of the phosphor, an inorganic compound to form a liquid phase at a temperature of a firing temperature or lower may be added and the firing is conducted. The inorganic compound to form the liquid phase may serve as a flux to promote the reaction and particle growth such that a stable crystal may be obtained and that the emission intensity may be improved.

The inorganic compound to form the liquid phase at the temperature of the firing temperature or lower may include a single kind of or a mixture of two or more kinds of fluoride, chloride, iodide, bromide, or phosphate of one or two or more kinds of elements selected from Li, Na, K, Mg, Ca, Sr, and Ba. These inorganic compounds have different melting points, respectively, and therefore may be used selectively depending on a synthesizing temperature.

Further, the content amount of the inorganic compound forming the liquid phase at the temperature of the firing temperature or lower is decreased by washing the phosphor with a solvent after the firing. Thus, the emission intensity of the phosphor may occasionally become high.

When the phosphor of the present invention is used in an application of a light-emitting device or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. As examples of the liquid medium, an addition reaction type silicone resin and a condensation reaction type silicone resin before curing, a modified silicone resin, an epoxy resin, a polyvinyl resin, a polyethylene resin, a polypropylene resin, a polyester resin, and so on are named. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally at least 3 wt %, or preferably at least 5 wt %, and generally not exceeding 30 wt %, or preferably not exceeding 15 wt % in terms of the weight ratio of the liquid medium to the phosphor of the present invention.

Further, the phosphor-containing composition of the present invention may contain, in addition to the phosphor and the liquid medium, any other component depending on an application or the like. As examples of the other component, a dispersing agent, a thickening agent, an extending agent, a buffering agent, and so on are named. Specifically, silica fine powder such as Aerosil, alumina, and so on may be named.

The light-emitting device of the present invention comprises at least a light-emitting body or an emission source, and the phosphor wherein the phosphor includes at least the above-described the phosphor of the present invention.

As the light-emitting body or the emission source, there are an LED light-emitting instrument, a laser diode light-emitting device, a semiconductor laser, an organic EL light-emitting instrument, a fluorescent lamp, and so on. The LED light-emitting device can be manufactured using the phosphor of the present invention and by a publicly known method which is described in Japanese Patent Application Publication No. H05(1993)-152609, Japanese Patent Application Publication No. H07(1995)-99345, Japanese Patent No. 2927279, or the like. In this case, the light-emitting body or the emission source is preferably what emits light of a wavelength from 330 to 500 nm. In particular, an LED light-emitting element emitting an ultraviolet (or violet) ray of a wavelength from 330 to 420 nm, or an LED light-emitting element emitting blue light in a wavelength from 420 to 500 nm is preferable. Such LED light-emitting elements include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphors selected from β-sialon green phosphor activated with Eu, α-sialon yellow phosphor activated with Eu, $Sr_2Si_5N_8$ orange phosphor activated with Eu, (Ca,Sr)AlSiN$_3$ orange phosphor activated with Eu wherein both Ca and Sr are present, and CaAlSiN$_3$ red phosphor activated with Eu. As the yellow phosphor other than the above, for example, YAG:Ce, $(Ca,Sr,Ba)Si_2O_2N_2$:Eu wherein at least one of Ca, Sr, and Ba is present, and the like may be used.

As one aspect of the light-emitting device of the present invention, there is a light-emitting device in which a light-emitting body or an emission source emits ultraviolet light or visible light having a peak wavelength of 280 to 500 nm such that the phosphor of the present invention emits light of blue-to-orange color, which is mixed with light having a wavelength of at least 450 nm emitted by another phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of 420 nm to 500 nm or less by means of the light-emitting body or the emission source can further be included. As examples of such a blue phosphor, there are AlN:(Eu,Si) wherein both Eu and Si are present, $BaMgAl_{10}O_{17}$:Eu, $SrSi_9Al_{19}O_{31}$:Eu, $LaSi_9Al_{19}N_{32}$: Eu, α-sialon:Ce, JEM:Ce, and so on.

As one aspect of the light-emitting device of the present invention, in addition to the phosphor of the present invention, a green phosphor emitting light having a peak wavelength of at least 500 nm and not exceeding 550 nm by means of the light-emitting body or the emission source can further be included. As examples of such a green phosphor, there are β-sialon:Eu, $(Ba,Sr,Ca,Mg)_2SiO_4$:Eu wherein at least one of Ba, Sr, Ca, and Mg is present, (Ca,Sr,Ba)$Si_2O_2N_2$:Eu wherein at least one of Ca, Sr, and Ba is present, and so on.

As one aspect of the light-emitting device of the present invention, in addition to the phosphor of the present invention, a yellow phosphor emitting light having a peak wavelength of at least 550 nm and not exceeding 600 nm by means of the light-emitting body or the emission source can further be included. As examples of such a yellow phosphor, there are YAG:Ce, α-sialon:Eu, CaAlSiN$_3$:Ce, $La_3Si_6N_{11}$:Ce, and so on.

As one aspect of the light-emitting device of the present invention, in addition to the phosphor of the present invention, a red phosphor emitting light having a peak wavelength of at least 600 nm and not exceeding 700 nm by means of the light-emitting body or the emission source can further be included. As examples of such a red phosphor, there are CaAlSiN$_3$:Eu, (Ca,Sr)AlSiN$_3$:Eu wherein both Ca and Sr are present, $Ca_2Si_5N_8$:Eu, $Sr_2Si_5N_8$:Eu, and so on.

As one aspect of the light-emitting device of the present invention, a light-emitting device with high efficiency can be configured since the emission efficiency is high if an LED in which the light-emitting body or the emission source emits light having a wavelength of 320 to 450 nm is used.

Here, the above-mentioned aspects of light-emitting device are just examples and it should be understood that light of a white color with a desirable tinge can be achieved by combining a blue phosphor, a green phosphor, a yellow phosphor or a red phosphor in addition to the phosphor of the present invention.

An image display device of the present invention comprises at least an excitation source and a phosphor and the phosphor comprises at least the above-described phosphors of the present invention.

As the image display device, there are a fluorescent display tube (VFD), a field emission display (FED), a plasma display panel (PDP), a cathode-ray tube (CRT), a liquid crystal display (LCD), and so on. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor of the present invention comprising, as the main component, an inorganic compound having a specific chemical composition has a white or yellow color as an object color, and thus can be used as a pigment or fluorescent pigment. That is, the object color of white or yellow is observed when the phosphor of the present invention is irradiated with sunlight, light from a fluorescent lamp, or the like such that the phosphor of the present invention is suitable for an inorganic pigment because the phosphor is brightly-colored and does not degrade over a long period of time. Therefore, when the phosphor of the present invention is used for a paint, ink, color, glaze, colorant to be added to a plastic product or the like, a favorable coloring can be maintained at a high level for a long period of time.

The phosphor of the present invention absorbs ultraviolet ray so as to be suitable also as the ultraviolet absorber. Thus, when the phosphor of the present invention is used as the paint or applied onto a surface of the plastic product or kneaded into an inside thereof, a shielding effect thereof against the ultraviolet ray is so high that the product may be effectively protected from the ultraviolet degradation.

EXAMPLES

The present invention will be described in more detail with reference to the examples to be shown below, but these examples are disclosed only for the purpose of facilitating understanding of the present invention readily such that the present invention is not limited to these examples.
[Raw Materials Used for Synthesis]

The raw material powders used for the synthesis were: silicon nitride powder with a particle size of specific surface area of 11.2 m$^2$/g, oxygen content of 1.29 wt %, and a type content of 95% (SN-E10 grade; made by Ube Industries, Ltd.); silicon dioxide powder ($SiO_2$; made by Kojundo Chemical Laboratory Co., Ltd.); aluminum oxide powder with a particle size of specific surface area of 13.2 m$^2$/g (TAIMICRON; made by Taimei Chemicals Co., Ltd.); calcium oxide (made by Koj undo Chemical Laboratory Co., Ltd.); strontium oxide (made by Kojundo Chemical Laboratory Co., Ltd.); barium oxide (made by Kojundo Chemical Laboratory Co., Ltd.); and europium oxide (Eu203; with purity of 99.9% and made by Shin-Etsu Chemical Co., Ltd.).
[Synthesis and Structure Analysis of $Ca_2Si_5O_3N_6$:$Eu^{2+}$ Crystal]

Silicon nitride ($Si_3N_4$); silicon dioxide ($SiO_2$); calcium oxide (CaO); and europium oxide ($Eu_2O_3$) were mixed in the cation ratios of Ca:Eu:Si=13.84:2.16:40 such that a mixture composition thereof was designed. These raw material powders were weighed to be the above-mentioned mixture composition, and mixed for 5 minutes using a pestle and a mortar, each of them being made of sintered silicon nitride body. Next, the thus-obtained powder mixture was fed into a crucible made of sintered boron nitride body. A bulk density of the powder mixture (powder-like body) was approximately 33%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1,700° C. at a rate of 500° C. per hour, and then the temperature was maintained for two (2) hours. The synthesized compound was observed with the microscope. The result is shown in FIG. 3.

Figure 3:
FIG. 3 is a diagram showing a picture of a synthesized compound.

FIG. 3 is a diagraph showing a picture of the synthesized compound.

In FIG. 3, a crystal particle collected from the synthesized compound is shown. The size of the crystal particle was 55 μm×13 μm×8 μm.

The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ca, Eu, Si, O and N elements was confirmed, and ratios of the respective numbers of contained atoms thereof were measured to be 13.84:2.16:40.

Next, the crystal particle was fixed to a tip top of a glass fiber with an organic adhesive. An X-ray diffraction measurement of the crystal particle was performed under a condition in which an output of an X-ray source was 50 kV and 50 mA using a single crystal X-ray diffractometer with a rotating target of Mo Kα-line (SMART APEX II Ultra made by Bruker AXS Inc.) such that it was confirmed that the crystal particle was a single crystal.

Next, the crystal structure was determined using a single crystal structure analysis software (APEX2 made by Bruker AXS Inc.) from the results of X-ray diffraction measurement. The crystal structure data thus-obtained are shown in Table 1, and a diagram of the crystal structure is shown in FIG. 1. The crystal system, the space group, the lattice constants, and the kinds and positions of atoms are described in Table 1, and the shape and the size of the unit cell and the arrangement of atoms therein can be determined using the data. Oxygen and nitrogen enter in the equivalent atom positions at certain ratios, which may be averaged as a whole to matche the compositional fraction.

It was found that this crystal belonged to the monoclinic crystal system (monoclinic) and belonged to the space group Cm (space group No. 8 of the International Tables for Crystallography), that the lattice constants a, b, and c were determined as follows: a=0.70588 nm; b=2.37480 nm; and c=0.96341 nm, and that the angles α, β, and γ were determined as follows: angle α=90°; β=109.038°; and γ=90°. Further, the atom positions were determined as shown in Table 1. Also, while oxygen and nitrogen can occupy the sites which X is supposed to occupy in the sialon system crystal in general, since Ca is divalent (+2) and Si is tetravalent (+4), if the atomic positions and an amount ratio of Ca and Si are given, the ratio of O and N which occupy (O, N) positions can be determined from the condition of the electrical neutrality of the crystal. The composition of this crystal obtained from the ratios of Ca:Eu:Si measured by the EDS and the crystal structure data was $Ca_{1.73}Eu_{0.27}Si_5O_3N_6$ (that is, $Eu^{2+}$-solid-solved $Ca_2Si_5O_3N_6$ crystal).

Here, in the case where the crystal composition is different from the starting raw material composition, this may be caused by producing another composition other than $Ca_{1.73}Eu_{0.27}Si_5O_3N_6$ as a second phase of a small amount, but the single crystal was used in the present measurement such that the analysis reult shows the crystal structure of pure $Ca_2Si_5O_3N_6$:$Eu^{2+}$ crystal.

When a similar composition thereof was examined, the $Ca_2Si_5O_3N_6$ crystal was found to allow Ba or Sr to substitute partially or entirely Ca while the crystal structure remains the same. That is, the crystal of $A_2Si_5O_3N_6$ (A is one or two kinds of elements selected from Ca, Ba, and Sr, or a mixture thereof) has the same crystal structure as the $Ca_2Si_5O_3N_6$ crystal. Further, with respect to this crystal, it was confirmed that Al could substitute partially Si and oxygen could substitute partially N, and that the crystal was one of the compositions of the crystal groups having the crystal structure identical to that of $Ca_2Si_5O_3N_6$. This crystal also can be described as a composition expressed by $Ca_2Si_{5-x}Al_xO_{3+x}N_{6-x}$, (Ca, Ba)$_2Si_{5-x}Al_xO_{3+x}N_{6-x}$ wherein both Ca and Ba are present, (Ca,Sr)$_2Si_{5-x}Al_xO_{3+x}N_{6-x}$ wherein both Ca and Sr are present, or (Ca,Ba,Sr)$_2Si_{5-x}Al_xO_{3+x}N_{6-x}$ wherein at least one of Ca, Ba, and Sr is present (where 0≤x≤4) based on the condition of the electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the $Ca_2Si_5O_3N_6$ system crystal as shown in FIG. 1 by performing a powder X-ray diffraction measurement of the synthesized compound and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure as the $Ca_2Si_5O_3N_6$ system crystal and has the varied lattice constants, the formation of the $Ca_2Si_5O_3N_6$ system crystal can be judged by comparing the measured pattern with the calculated pattern. Here, "the measured powder X-ray diffraction pattern is the same as in FIG. 2" means that peak positions (2θ) of major peaks of the powder X-ray diffraction pattern match or substantially match.

When this crystal was irradiated by the black light, it was confirmed that it emitted yellow-to-orange light.

Phosphor Examples and Comparative Example; Examples 1 to 67

According to the design compositions as shown in Tables 2 and 3, raw materials were weighed to be mixture compositions (mass ratios) as shown in Table 4. Although there may be a case in which a design composition in Tables 2 and 3 and a corresponding mixture composition in Table 4 show discrepancy in the composition depending on the kind of each raw material to be used, the mixture composition was determined such that the amount of each metal ion matches therebetween in such a case. As the whole synthesized phosphor, a difference constituent caused by a composition difference from the crystal composition of the assumed crystal is mixed into the product (phosphor) as a second phase, but its amount is so small that the effect on the performance of the phosphor is slight. Therefore, the thus-synthesized phosphor includes a single crystal particle (a host crystal in which a solid-solution element is solid-solved may be included) such that the thus-synthesized phosphor may be included in the phosphor of the present invention. Weighed raw material powders were mixed for 5 minutes using a pestle and a mortar made of silicon nitride sintered body. Then, the powder mixture was fed into a crucible made of boron nitride sintered body. A bulk density of the powder body was approximately from 20% to 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 5, and then the temperature was maintained for two (2) or four (4) hours.

TABLE 2

Design compositions (atomic ratios) in Examples and Comparative Examples

| Example | | M element | | A element | | | E element | D element | X element | |
|---|---|---|---|---|---|---|---|---|---|---|
| | | | | Ca | Ba | Sr | Al | Si | O | N |
| Comparative example | 1 | | | 2 | | | | 5 | 3 | 6 |
| Example | 2 | Eu | 0.0025 | 1.875 | 0.125 | | | 5 | 3 | 6 |
| Example | 3 | Eu | 0.0025 | 1.75 | 0.25 | | | 5 | 3 | 6 |
| Example | 4 | Eu | 0.0025 | 1.625 | 0.375 | | | 5 | 3 | 6 |
| Example | 5 | Eu | 0.0025 | 1.5 | 0.5 | | | 5 | 3 | 6 |
| Example | 6 | Eu | 0.0063 | 1.61875 | 0.375 | | | 5 | 3 | 6 |
| Example | 7 | Eu | 0.0125 | 1.6125 | 0.375 | | | 5 | 3 | 6 |
| Example | 8 | Eu | 0.0025 | 1.6225 | 0.375 | | | 5 | 3 | 6 |
| Example | 9 | Eu | 0.0025 | 1.6225 | 0.375 | | 0.125 | 4.875 | 3.125 | 5.875 |
| Example | 10 | Eu | 0.0025 | 1.6225 | 0.375 | | 0.25 | 4.75 | 3.25 | 5.75 |
| Example | 11 | Eu | 0.0025 | 1.6225 | 0.375 | | 0.5 | 4.5 | 3.5 | 5.5 |
| Example | 12 | Eu | 0.0025 | 1.875 | 0.125 | | | 5 | 3 | 6 |
| Example | 13 | Eu | 0.0025 | 1.75 | 0.25 | | | 5 | 3 | 6 |
| Example | 14 | Eu | 0.0025 | 1.625 | 0.375 | | | 5 | 3 | 6 |
| Example | 15 | Eu | 0.0025 | 1.5 | 0.5 | | | 5 | 3 | 6 |
| Example | 16 | Eu | 0.0063 | 1.61875 | 0.375 | | | 5 | 3 | 6 |
| Example | 17 | Eu | 0.0125 | 1.6125 | 0.375 | | | 5 | 3 | 6 |
| Example | 18 | Eu | 0.0025 | 1.6225 | 0.375 | | | 5 | 3 | 6 |
| Example | 19 | Eu | 0.0025 | 1.6225 | 0.375 | | 0.125 | 4.875 | 3.125 | 5.875 |
| Example | 20 | Eu | 0.0025 | 1.6225 | 0.375 | | 0.25 | 4.75 | 3.25 | 5.75 |
| Example | 21 | Eu | 0.0025 | 1.6225 | 0.375 | | 0.5 | 4.5 | 3.5 | 5.5 |
| Example | 22 | Eu | 0.0625 | 1.5625 | 0.375 | | | 5 | 3 | 6 |
| Example | 23 | Eu | 0.1250 | 1.5 | 0.375 | | | 5 | 3 | 6 |
| Comparative example | 24 | | | 1.5 | 0.5 | | | 5 | 3 | 6 |
| Example | 25 | Eu | 0.0500 | 1.5 | 0.45 | | | 5 | 3 | 6 |
| Example | 26 | Eu | 0.1000 | 1.5 | 0.4 | | | 5 | 3 | 6 |
| Example | 27 | Eu | 0.1500 | 1.5 | 0.35 | | | 5 | 3 | 6 |
| Comparative example | 28 | | | 1.5 | 0.5 | | | 5 | 3 | 6 |
| Example | 29 | Eu | 0.0500 | 1.5 | 0.45 | | | 5 | 3 | 6 |
| Example | 30 | Eu | 0.0625 | 1.5625 | 0.375 | | | 5 | 3 | 6 |
| Example | 31 | Eu | 0.1000 | 1.5 | 0.4 | | | 5 | 3 | 6 |
| Example | 32 | Eu | 0.1500 | 1.5 | 0.35 | | | 5 | 3 | 6 |
| Example | 33 | Eu | 0.3000 | 1.5 | 0.2 | | | 5 | 3 | 6 |
| Example | 34 | Eu | 0.5000 | 1.4 | 0.1 | | | 5 | 3 | 6 |
| Example | 35 | Eu | 0.4600 | 1.54 | | | | 5 | 3 | 6 |
| Example | 36 | Eu | 0.5000 | 1.5 | | | | 5 | 3 | 6 |
| Example | 37 | Eu | 0.6000 | 1.4 | | | | 5 | 3 | 6 |
| Comparative example | 38 | | | 1.5 | | 0.5 | | 5 | 3 | 6 |
| Example | 39 | Eu | 0.1500 | 1.5 | | 0.35 | | 5 | 3 | 6 |
| Example | 40 | Eu | 0.1500 | 1.5 | | 0.35 | | 5 | 3 | 6 |
| Example | 41 | Eu | 0.1500 | 1.5 | | 0.35 | | 5 | 3 | 6 |

TABLE 2-continued

Design compositions (atomic ratios) in Examples and Comparative Examples

| Example | | M element | A element Ca | A element Ba | A element Sr | E element Al | D element Si | X element O | X element N |
|---|---|---|---|---|---|---|---|---|---|
| Example | 42 | Eu 0.5000 | 1.4 | | 0.1 | | 5 | 3 | 6 |
| Comparative example | 43 | | 1.5 | | 0.5 | | 5 | 3 | 6 |
| Example | 44 | Eu 0.0500 | 1.5 | | 0.45 | | 5 | 3 | 6 |
| Example | 45 | Eu 0.1000 | 1.5 | | 0.4 | | 5 | 3 | 6 |
| Example | 46 | Eu 0.1500 | 1.5 | | 0.35 | | 5 | 3 | 6 |
| Example | 47 | Eu 0.1500 | 1.5 | | 0.35 | | 5 | 3 | 6 |
| Example | 48 | Eu 0.1500 | 1.5 | | 0.35 | | 5 | 3 | 6 |
| Example | 49 | Eu 0.2500 | 1.5 | | 0.35 | | 5 | 3 | 6 |
| Example | 50 | Eu 0.3000 | 1.5 | | 0.2 | | 5 | 3 | 6 |
| Example | 51 | Eu 0.4000 | 1.5 | | 0.1 | | 5 | 3 | 6 |
| Example | 52 | Eu 0.1000 | 1.5 | 0.35 | 0.03 | | 5 | 3 | 6 |
| Example | 53 | Eu 0.1000 | 1.5 | 0.3 | 0.1 | | 5 | 3 | 6 |
| Example | 54 | Eu 0.1000 | 1.5 | 0.2 | 0.2 | | 5 | 3 | 6 |
| Example | 55 | Eu 0.1500 | 1.5 | 0.3 | 0.05 | | 5 | 3 | 6 |
| Example | 56 | Eu 0.1500 | 1.5 | 0.25 | 0.1 | | 5 | 3 | 6 |
| Example | 57 | Eu 0.1500 | 1.5 | 0.15 | 0.2 | | 5 | 3 | 6 |
| Example | 58 | Eu 0.1000 | 1.5 | 0.35 | 0.05 | | 5 | 3 | 6 |
| Example | 59 | Eu 0.1000 | 1.5 | 0.3 | 0.1 | | 5 | 3 | 6 |
| Example | 60 | Eu 0.1000 | 1.5 | 0.2 | 0.2 | | 5 | 3 | 6 |
| Example | 61 | Eu 0.1500 | 1.5 | 0.3 | 0.05 | | 5 | 3 | 6 |
| Example | 62 | Eu 0.1500 | 1.5 | 0.25 | 0.1 | | 5 | 3 | 6 |
| Example | 63 | Eu 0.1500 | 1.5 | 0.15 | 0.2 | | 5 | 3 | 6 |
| Example | 64 | Eu 0.1000 | 1.5 | | 0.4 | 0.25 | 4.75 | 3.25 | 5.75 |
| Example | 65 | Eu 0.1000 | 1.5 | | 0.4 | 0.5 | 4.5 | 3.5 | 5.5 |
| Example | 66 | Eu 0.1000 | 1.5 | | 0.4 | 0.25 | 4.75 | 3.25 | 5.75 |
| Example | 67 | Eu 0.1000 | 1.5 | | 0.4 | 0.5 | 4.5 | 3.5 | 5.5 |

TABLE 3

Design compositions (parameters) in Examples and Comparative examples

| Example | | M element (d) | A element (e) Ca | A element (e) Ba | A element (e) Sr | E element (g) Al | D element (i) Si | X element (h) G(h1) | X element (h) N(h2) |
|---|---|---|---|---|---|---|---|---|---|
| Comparative example | 1 | | 0.125 | | | | 0.3125 | 0.1875 | 0.375 |
| Example | 2 | Eu 0.000156 | 0.117169 | 0.007811 | | | 0.312451 | 0.187471 | 0.374941 |
| Example | 3 | Eu 0.000156 | 0.109358 | 0.015623 | | | 0.312451 | 0.187471 | 0.374941 |
| Example | 4 | Eu 0.000156 | 0.101547 | 0.023434 | | | 0.312451 | 0.187471 | 0.374941 |
| Example | 5 | Eu 0.000156 | 0.093735 | 0.032245 | | | 0.312451 | 0.187471 | 0.374941 |
| Example | 6 | Eu 0.000391 | 0.101172 | 0.023438 | | | 0.3125 | 0.1875 | 0.375 |
| Example | 7 | Eu 0.000781 | 0.100781 | 0.023438 | | | 0.3125 | 0.1875 | 0.375 |
| Example | 8 | Eu 0.000156 | 0.101406 | 0.023438 | | | 0.3125 | 0.1875 | 0.375 |
| Example | 9 | Eu 0.000156 | 0.104106 | 0.023438 | | 0.007813 | 0.304688 | 0.195313 | 0.367188 |
| Example | 10 | Eu 0.000156 | 0.101406 | 0.023438 | | 0.015625 | 0.296875 | 0.203125 | 0.359375 |
| Example | 11 | Eu 0.000156 | 0.101406 | 0.023438 | | 0.03125 | 0.28125 | 0.21875 | 0.34375 |
| Example | 12 | Eu 0.000156 | 0.117169 | 0.007511 | | | 0.312451 | 0.187471 | 0.374941 |
| Example | 13 | Eu 0.000156 | 0.109358 | 0.015623 | | | 0.312451 | 0.187471 | 0.374941 |
| Example | 14 | Eu 0.000156 | 0.101547 | 0.023434 | | | 0.312451 | 0.187471 | 0.374941 |
| Example | 15 | Eu 0.000156 | 0.093735 | 0.052245 | | | 0.312451 | 0.187471 | 0.374941 |
| Example | 16 | Eu 0.000391 | 0.101172 | 0.023438 | | | 0.3125 | 0.1875 | 0.375 |
| Example | 17 | Eu 0.000781 | 0.100781 | 0.023438 | | | 0.3125 | 0.1875 | 0.375 |
| Example | 18 | Eu 0.000156 | 0.101406 | 0.023438 | | | 0.3125 | 0.1875 | 0.375 |
| Example | 19 | Eu 0.000156 | 0.101406 | 0.023438 | | 0.007813 | 0.304688 | 0.195313 | 0.367188 |
| Example | 20 | Eu 0.000156 | 0.101406 | 0.023438 | | 0.015625 | 0.296875 | 0.203125 | 0.359375 |
| Example | 21 | Eu 0.000156 | 0.101406 | 0.023438 | | 0.03125 | 0.28125 | 0.21875 | 0.34375 |
| Example | 22 | Eu 0.003906 | 0.097656 | 0.023438 | | | 0.3125 | 0.1875 | 0.375 |
| Example | 23 | Eu 0.007813 | 0.09375 | 0.023438 | | | 0.3125 | 0.1875 | 0.375 |
| Comparative example | 24 | | 0.09375 | 0.03125 | | | 0.3125 | 0.1875 | 0.375 |
| Example | 25 | Eu 0.003125 | 0.09375 | 0.028125 | | | 0.3125 | 0.1875 | 0.375 |
| Example | 26 | Eu 0.00625 | 0.09375 | 0.025 | | | 0.3125 | 0.1875 | 0.375 |
| Example | 27 | Eu 0.003375 | 0.09375 | 0.021875 | | | 0.3125 | 0.1875 | 0.375 |
| Comparative example | 28 | | 0.09375 | 0.03125 | | | 0.3125 | 0.1875 | 0.375 |
| Example | 29 | Eu 0.003125 | 0.09375 | 0.025125 | | | 0.3125 | 0.1875 | 0.375 |
| Example | 30 | Eu 0.003906 | 0.097656 | 0.023438 | | | 0.3125 | 0.1875 | 0.375 |
| Example | 31 | Eu 0.00625 | 0.09375 | 0.025 | | | 0.3125 | 0.1875 | 0.375 |
| Example | 32 | Eu 0.009375 | 0.09375 | 0.021875 | | | 0.3125 | 0.1875 | 0.375 |
| Example | 33 | Eu 0.01875 | 0.09375 | 0.0125 | | | 0.3125 | 0.1875 | 0.375 |
| Example | 34 | Eu 0.03125 | 0.0875 | 0.00625 | | | 0.3125 | 0.1875 | 0.375 |
| Example | 35 | Eu 0.02875 | 0.09625 | | | | 0.3125 | 0.1875 | 0.375 |
| Example | 36 | Eu 0.03125 | 0.09375 | | | | 0.3125 | 0.1875 | 0.375 |

TABLE 3-continued

Design compositions (parameters) in Examples and Comparative examples

| Example | | M element (d) | | A element (e) | | | E element (g) | D element (i) | X element (h) | |
|---|---|---|---|---|---|---|---|---|---|---|
| | | | | Ca | Ba | Sr | Al | Si | G(h1) | N(h2) |
| Example | 37 | Eu | 0.0375 | 0.0875 | | | | 0.3125 | 0.1875 | 0.375 |
| Comparative example | 38 | | | | 0.09375 | 0.03125 | | 0.3125 | 0.1875 | 0.375 |
| Example | 39 | Eu | 0.009375 | | 0.09375 | 0.021875 | | 0.3125 | 0.1875 | 0.375 |
| Example | 40 | Eu | 0.009375 | | 0.09375 | 0.021875 | | 0.3125 | 0.1875 | 0.375 |
| Example | 41 | Eu | 0.009375 | | 0.09375 | 0.021875 | | 0.3125 | 0.1875 | 0.375 |
| Example | 42 | Eu | 0.03125 | 0.0875 | | 0.00625 | | 0.3125 | 0.1875 | 0.375 |
| Comparative example | 43 | | | | 0.09375 | 0.03125 | | 0.3125 | 0.1875 | 0.375 |
| Example | 44 | Eu | 0.003125 | | 0.09375 | 0.028125 | | 0.3125 | 0.1875 | 0.375 |
| Example | 45 | Eu | 0.00625 | | 0.09375 | 0.025 | | 0.3125 | 0.1875 | 0.375 |
| Example | 46 | Eu | 0.009375 | | 0.09375 | 0.021875 | | 0.3125 | 0.1875 | 0.375 |
| Example | 47 | Eu | 0.009375 | | 0.09375 | 0.021875 | | 0.3125 | 0.1875 | 0.375 |
| Example | 48 | Eu | 0.009375 | | 0.09375 | 0.021875 | | 0.3125 | 0.1875 | 0.375 |
| Example | 49 | Eu | 0.009375 | | 0.09375 | 0.021875 | | 0.3125 | 0.1875 | 0.375 |
| Example | 50 | Eu | 0.01875 | | 0.09375 | 0.0125 | | 0.3125 | 0.1875 | 0.375 |
| Example | 51 | Eu | 0.025 | | 0.09375 | 0.00625 | | 0.3125 | 0.1875 | 0.375 |
| Example | 52 | Eu | 0.00625 | | 0.09375 | 0.021875 | 0.003125 | 0.3125 | 0.1875 | 0.375 |
| Example | 53 | Eu | 0.00625 | | 0.09375 | 0.01875 | 0.00625 | 0.3125 | 0.1875 | 0.375 |
| Example | 54 | Eu | 0.00625 | | 0.09375 | 0.0125 | 0.0125 | 0.3125 | 0.1875 | 0.375 |
| Example | 55 | Eu | 0.009375 | | 0.09375 | 0.01875 | 0.003125 | 0.3125 | 0.1875 | 0.375 |
| Example | 56 | Eu | 0.009375 | | 0.09375 | 0.015625 | 0.00625 | 0.3125 | 0.1875 | 0.375 |
| Example | 57 | Eu | 0.009375 | | 0.09375 | 0.003375 | 0.0125 | 0.3125 | 0.1875 | 0.375 |
| Example | 58 | Eu | 0.00625 | | 0.09375 | 0.021875 | 0.003125 | 0.3125 | 0.1875 | 0.375 |
| Example | 59 | Eu | 0.00625 | | 0.09375 | 0.01875 | 0.00625 | 0.3125 | 0.1875 | 0.375 |
| Example | 60 | Eu | 0.00625 | | 0.09375 | 0.0125 | 0.0125 | 0.3125 | 0.1875 | 0.375 |
| Example | 61 | Eu | 0.009375 | | 0.09375 | 0.01875 | 0.003125 | 0.3125 | 0.1875 | 0.375 |
| Example | 62 | Eu | 0.009375 | | 0.09375 | 0.015625 | 0.00625 | 0.3125 | 0.1875 | 0.375 |
| Example | 63 | Eu | 0.009375 | | 0.09375 | 0.009375 | 0.0125 | 0.3125 | 0.1875 | 0.375 |
| Example | 64 | Eu | 0.00625 | | 0.09375 | | 0.025 | 0.015625 | 0.296875 | 0.203125 | 0.359375 |
| Example | 65 | Eu | 0.00625 | | 0.09375 | | 0.025 | 0.03125 | 0.28125 | 0.21875 | 0.34375 |
| Example | 66 | Eu | 0.00625 | | 0.09375 | | 0.025 | 0.015625 | 0.296875 | 0.203125 | 0.359375 |
| Example | 67 | Eu | 0.00625 | | 0.09375 | | 0.025 | 0.03125 | 0.28125 | 0.21875 | 0.34375 |

TABLE 4

Raw material mixture compositions (mass ratios) in Examples and Comparative examples

| Example | | Si$_3$N$_4$ | SiO$_2$ | Al$_2$O$_3$ | CaO | BaO | SrO | Eu$_2$O$_3$ |
|---|---|---|---|---|---|---|---|---|
| Comparative example | 1 | 52.06 | 15.72 | | 31.22 | | | |
| Example | 2 | 57.54 | 8.20 | | 28.80 | 5.25 | | 0.12 |
| Example | 3 | 55.79 | 7.93 | | 26.01 | 10.16 | | 0.12 |
| Example | 4 | 54.05 | 7.68 | | 23.40 | 14.76 | | 0.11 |
| Example | 5 | 52.41 | 7.45 | | 20.95 | 19.09 | | 0.11 |
| Example | 6 | 54.00 | 7.68 | | 23.29 | 14.75 | | 0.28 |
| Example | 7 | 53.92 | 7.64 | | 23.16 | 14.72 | | 0.56 |
| Example | 8 | 54.05 | 7.71 | | 23.37 | 14.77 | | 0.11 |
| Example | 9 | 52.91 | 7.22 | 1.64 | 23.36 | 14.76 | | 0.11 |
| Example | 10 | 51.77 | 5.74 | 3.27 | 23.36 | 14.76 | | 0.11 |
| Example | 11 | 49.49 | 5.77 | 6.54 | 23.34 | 14.75 | | 0.11 |
| Example | 12 | 57.64 | 8.20 | | 28.80 | 5.25 | | 0.12 |
| Example | 13 | 55.79 | 7.93 | | 16.01 | 10.16 | | 0.12 |
| Example | 14 | 54.05 | 7.68 | | 23.40 | 14.76 | | 0.11 |
| Example | 15 | 52.41 | 7.45 | | 20.95 | 19.09 | | 0.11 |
| Example | 16 | 54.00 | 7.68 | | 23.29 | 14.75 | | 0.28 |
| Example | 17 | 53.92 | 7.64 | | 23.16 | 14.72 | | 0.56 |
| Example | 18 | 54.05 | 7.71 | | 23.37 | 14.77 | | 0.11 |
| Example | 19 | 52.91 | 7.22 | 1.64 | 23.36 | 14.76 | | 0.11 |
| Example | 20 | 51.77 | 6.74 | 3.27 | 23.36 | 14.76 | | 0.11 |
| Example | 21 | 49.49 | 5.77 | 6.54 | 23.34 | 14.75 | | 0.11 |
| Example | 22 | 53.27 | 7.34 | | 22.11 | 14.51 | | 2.78 |
| Example | 23 | 52.49 | 5.98 | | 20.84 | 14.24 | | 5.45 |
| Comparative example | 24 | 52.442 | 7.487 | | 20.97 | 19.11 | | |
| Example | 25 | 52.461 | 7.282 | | 20.92 | 17.15 | | 2.19 |
| Example | 26 | 52.48 | 7.079 | | 20.87 | 15.21 | | 4.37 |
| Example | 27 | 52.5 | 6.876 | | 20.82 | 13.28 | | 6.53 |
| Comparative example | 28 | 52.442 | 7.487 | | 20.97 | 19.11 | | |
| Example | 29 | 52.461 | 7.282 | | 20.92 | 17.15 | | 2.19 |
| Example | 30 | 53.27 | 7.34 | | 22.11 | 14.51 | | 2.78 |

TABLE 4-continued

Raw material mixture compositions (mass ratios) in Examples and Comparative examples

| Example | | Si$_3$N$_4$ | SiO$_2$ | Al$_2$O$_3$ | CaO | BaO | SrO | Eu$_2$O$_3$ |
|---|---|---|---|---|---|---|---|---|
| Example | 31 | 52.48 | 7.079 | | 20.87 | 15.21 | | 4.37 |
| Example | 32 | 52.5 | 6.875 | | 20.82 | 13.28 | | 6.33 |
| Example | 33 | 52.556 | 6.273 | | 20.67 | 7.53 | | 12.97 |
| Example | 34 | 49.83 | 7.11 | | 18.59 | 3.63 | | 20.84 |
| Example | 35 | 53.12 | 5.69 | | 21.26 | | | 19.93 |
| Example | 36 | 52.631 | 5.483 | | 20.47 | | | 21.41 |
| Example | 37 | 49.56 | 7.08 | | 18.49 | | | 24.87 |
| Comparative example | 38 | 55.903 | 7.981 | | 22.35 | | 13.77 | |
| Example | 39 | 56.614 | 5.266 | | 21.85 | | 9.42 | 6.85 |
| Example | 40 | 58.385 | 3.33 | | 21.94 | | 9.46 | 6.88 |
| Example | 41 | 60.171 | 1.377 | | 22.04 | | 9.5 | 6.91 |
| Example | 42 | 50.42 | 7.20 | | 18.81 | | 2.48 | 21.08 |
| Comparative example | 43 | 55.903 | 7.981 | | 22.35 | | 13.77 | |
| Example | 44 | 55.549 | 7.711 | | 22.15 | | 12.28 | 2.32 |
| Example | 45 | 55.201 | 7.446 | | 21.95 | | 10.81 | 4.59 |
| Example | 46 | 54.86 | 7.185 | | 21.75 | | 9.38 | 6.83 |
| Example | 47 | 56.614 | 5.266 | | 21.85 | | 9.42 | 6.85 |
| Example | 48 | 58.385 | 3.33 | | 21.94 | | 9.46 | 6.88 |
| Example | 49 | 60.171 | 1.377 | | 22.04 | | 9.5 | 6.91 |
| Example | 50 | 53.872 | 6.43 | | 21.19 | | 5.22 | 13.29 |
| Example | 51 | 53.24 | 5.949 | | 20.82 | | 2.57 | 17.42 |
| Example | 52 | 52.805 | 7.123 | | 20.99 | 13.39 | 1.29 | 4.39 |
| Example | 53 | 53.136 | 7.167 | | 21.13 | 11.55 | 2.6 | 4.42 |
| Example | 54 | 53.807 | 7.258 | | 21.39 | 7.8 | 5.27 | 4.48 |
| Example | 55 | 52.824 | 6.918 | | 20.95 | 11.45 | 1.29 | 6.57 |
| Example | 56 | 53.152 | 6.962 | | 21.07 | 9.6 | 2.6 | 6.61 |
| Example | 57 | 53.822 | 7.049 | | 21.34 | 5.83 | 5.26 | 6.7 |
| Example | 58 | 52.805 | 7.123 | | 20.99 | 13.39 | 1.29 | 4.39 |
| Example | 59 | 53.136 | 7.167 | | 21.13 | 11.55 | 2.6 | 4.42 |
| Example | 60 | 53.807 | 7.258 | | 21.39 | 7.8 | 5.27 | 4.48 |
| Example | 61 | 52.824 | 6.918 | | 20.95 | 11.45 | 1.29 | 6.57 |
| Example | 62 | 53.152 | 6.962 | | 21.07 | 9.6 | 2.6 | 6.61 |
| Example | 63 | 53.822 | 7.049 | | 21.34 | 5.83 | 5.26 | 6.7 |
| Example | 64 | 52.884 | 6.462 | 3.32 | 21.94 | | 10.81 | 4.59 |
| Example | 65 | 50.567 | 5.48 | 6.64 | 21.92 | | 10.8 | 4.59 |
| Example | 66 | 52.884 | 6.462 | 3.32 | 21.94 | | 10.81 | 4.59 |
| Example | 67 | 50.567 | 5.48 | 6.64 | 21.92 | | 10.8 | 4.59 |

TABLE 5

Firing conditions in Examples and Comparative Examples

| Example | | Temperature (° C.) | Ambient pressure (Mpa) | Time (hour) |
|---|---|---|---|---|
| Comparative example | 1 | 1700 | 1 | 2 |
| Example | 2 | 1600 | 1 | 2 |
| Example | 3 | 1600 | 1 | 2 |
| Example | 4 | 1600 | 1 | 2 |
| Example | 5 | 1600 | 1 | 2 |
| Example | 6 | 1600 | 1 | 2 |
| Example | 7 | 1600 | 1 | 2 |
| Example | 8 | 1600 | 1 | 2 |
| Example | 9 | 1600 | 1 | 2 |
| Example | 10 | 1600 | 1 | 2 |
| Example | 11 | 1600 | 1 | 2 |
| Example | 12 | 1700 | 1 | 2 |
| Example | 13 | 1700 | 1 | 2 |
| Example | 14 | 1700 | 1 | 2 |
| Example | 15 | 1700 | 1 | 2 |
| Example | 16 | 1700 | 1 | 2 |
| Example | 17 | 1700 | 1 | 2 |
| Example | 18 | 1700 | 1 | 2 |
| Example | 19 | 1700 | 1 | 2 |
| Example | 20 | 1700 | 1 | 2 |
| Example | 21 | 1700 | 1 | 2 |
| Example | 22 | 1600 | 1 | 2 |
| Example | 23 | 1600 | 1 | 2 |
| Comparative example | 24 | 1600 | 1 | 4 |
| Example | 25 | 1600 | 1 | 4 |
| Example | 26 | 1600 | 1 | 4 |
| Example | 27 | 1600 | 1 | 4 |
| Comparative example | 28 | 1700 | 1 | 2 |
| Example | 29 | 1700 | 1 | 2 |
| Example | 30 | 1700 | 1 | 2 |
| Example | 31 | 1700 | 1 | 2 |
| Example | 32 | 1700 | 1 | 2 |
| Example | 33 | 1700 | 1 | 2 |
| Example | 34 | 1700 | 1 | 2 |
| Example | 35 | 1700 | 1 | 2 |
| Example | 36 | 1700 | 1 | 2 |
| Example | 37 | 1700 | 1 | 2 |
| Comparative example | 38 | 1600 | 1 | 4 |
| Example | 39 | 1600 | 1 | 4 |
| Example | 40 | 1600 | 1 | 4 |
| Example | 41 | 1600 | 1 | 4 |
| Example | 42 | 1700 | 1 | 2 |

TABLE 5-continued

Firing conditions in Examples and Comparative Examples

| Example | | Firing conditions | | |
|---|---|---|---|---|
| | | Temperature (° C.) | Ambient pressure (Mpa) | Time (hour) |
| Comparative example | 43 | 1700 | 1 | 2 |
| Example | 44 | 1700 | 1 | 2 |
| Example | 45 | 1700 | 1 | 2 |
| Example | 46 | 1700 | 1 | 2 |
| Example | 47 | 1700 | 1 | 2 |
| Example | 48 | 1700 | 1 | 2 |
| Example | 49 | 1700 | 1 | 2 |
| Example | 50 | 1700 | 1 | 2 |
| Example | 51 | 1700 | 1 | 2 |
| Example | 52 | 1600 | 1 | 4 |
| Example | 53 | 1600 | 1 | 4 |
| Example | 54 | 1600 | 1 | 4 |
| Example | 55 | 1600 | 1 | 4 |
| Example | 56 | 1600 | 1 | 4 |
| Example | 57 | 1600 | 1 | 4 |
| Example | 58 | 1700 | 1 | 2 |
| Example | 59 | 1700 | 1 | 2 |
| Example | 60 | 1700 | 1 | 2 |
| Example | 61 | 1700 | 1 | 2 |
| Example | 62 | 1700 | 1 | 2 |
| Example | 63 | 1700 | 1 | 2 |
| Example | 64 | 1600 | 1 | 4 |
| Example | 65 | 1600 | 1 | 4 |
| Example | 66 | 1700 | 1 | 2 |
| Example | 67 | 1700 | 1 | 2 |

Figure 4:
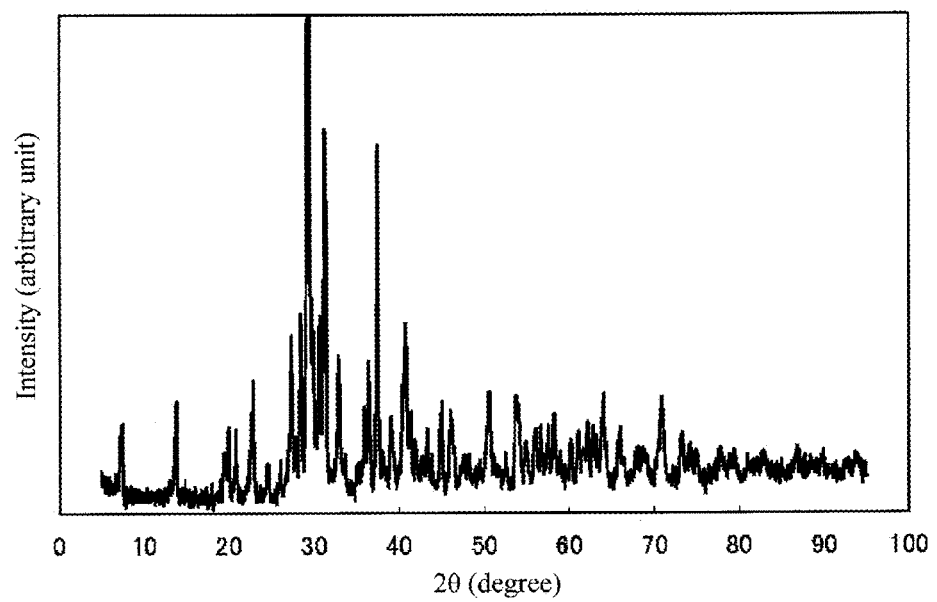
FIG. 4 is a diagram showing a resultant powder X-ray diffraction pattern of a synthesized compound in Example 23.
Figure 5:
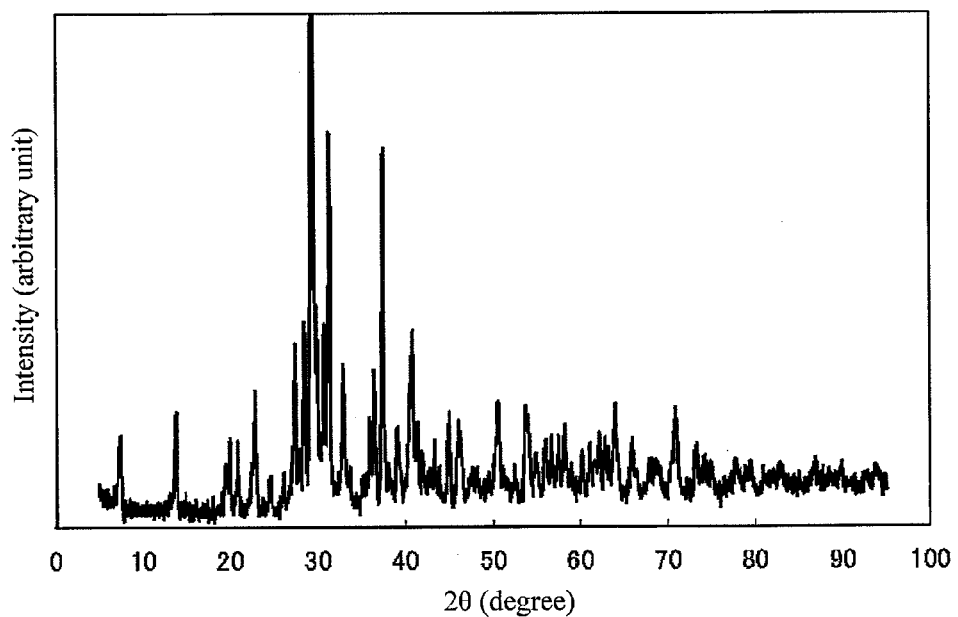
FIG. 5 is a diagram showing a resultant powder X-ray diffraction pattern of a synthesized compound in Example 11.

Next, each synthesized compound was ground using an agate mortar and the powder X-ray diffraction measurement using Cu Kα-line was carried out. Parts of the results are shown in FIGS. 4 and 5. Main formation phases are shown in Table 6. Elements contained in the synthesized compound were investigated by the EDS measurement. It was confirmed that the synthesized compounds of Examples 2-8, 12-18, and 22-63 included a rare earth element, alkaline earth metal, Si, O, and N. It was confirmed that the synthesized compounds of Examples 9-11, 19-21, and 64-67 included a rare earth element, alkaline earth metal, Al, Si, O, and N.

FIG. 4 is a diagram showing a resultant powder X-ray diffraction pattern of a synthesized compound in Example 23.

FIG. 5 is a diagram showing a resultant powder X-ray diffraction pattern of a synthesized compound in Example 11.

The powder X-ray diffraction pattern of the synthesized compound in Example 23 (FIG. 4) shows a good agreement with the powder X-ray diffraction pattern by the structure analysis (FIG. 2) and is the same X-ray diffraction pattern of the $Ca_2Si_5O_3N_6$ crystal such that it was found that the crystal having the crystal structure identical to that of the $Ca_2Si_5O_3N_6$ crystal was obtained. For example, peaks at $2\theta=7.43°$, $13.77°$, $20.03°$, $23.19°$, $27.31°$, $29.51°$, $31.41°$, $37.51°$, $40.71°$, and $63.97°$ in FIG. 2 correspond to peaks at $2\theta=7.45°$, $13.85°$, $20.05°$, $22.9°$, $27.45°$, $29.4°$, $31.3°$, $37.5°$, $40.8°$, and $63.95°$ in FIG. 4, respectively, although there are some cases in which the order of heights of intensities of the peaks is partially reversed, such that a good match is shown.

Similarly, the powder X-ray diffraction pattern of the synthesized compound in Example 11 (FIG. 5) shows a good agreement with the powder X-ray diffraction pattern by the structure analysis (FIG. 2) and is the same X-ray diffraction pattern of the $Ca_2Si_5O_3N_6$ crystal such that it was found that the crystal having the crystal structure identical to that of the $Ca_2Si_5O_3N_6$ crystal was obtained. For example, peaks at $2\theta=7.43°$, $13.77°$, $20.03°$, $23.19°$, $27.31°$, $29.51°$, $31.41°$, $37.51°$, $40.71°$, and $63.97°$ in FIG. 2 correspond to peaks at $2\theta=7.4°$, $13.85°$, $20.1°$, $22.95°$, $27.4°$, $29.45°$, $31.4°$, $37.55°$, $40.7°$, $63.9°$ in FIG. 5, respectively, although there are some cases in which the order of heights of intensities of the peaks is partially reversed, such that a good match is shown. Here, the deviation in the angle, $2\theta$, was assumed $\pm1$ degree.

Further, it was confirmed that the synthesized compound of Example 23 included Eu, Ca, Ba, Al, Si, O, and N from the EDS measurement. It was confirmed that the ratios of Eu:Ca:Ba:Si were 1:12:3:40. It was found that the synthesized compound of Example 23 was an inorganic compound of $Ca_2Si_5O_3N_6$ crystal into which Eu was solid-solved.

It was confirmed that the synthesized compound of Example 11 included Eu, Ca, Ba, Al, Si, O, and N. It was confirmed that the ratios of Eu:Ca:Ba:Al:Si were 0.02:12.98:3:4:36. It was found that the synthesized compound of Example 11 was an inorganic compound comprising the $(Ca,Ba)_2(Si,Al)_5(O,N)_9$ crystal wherein both Ca and Ba and both Si and Al are present, in respective parentheses (more specifically, $(Ca,Ba)_2Si_{5-x}Al_xO_{3+x}N_{6-x}$ (x=0.5)) in which Eu was solid-solved and was represented by $Eu_y(Ca,Ba)_{2-y}Si_{5-x}Al_xO_{3+x}N_{6-x}$ (x=0.5 and y=0.0025).

Although not shown in figure, similar powder X-ray diffraction patterns of other Examples were also obtained. The following shows results of comparison with respect to ten (10) major peaks thereof corresponding to respective major peaks in FIG. 2 in the same way.

TABLE 6

Main Formation Phases in Examples and Comparative Example

| | | Main formation phases | |
|---|---|---|---|
| Example | | Main phase | Sub phase |
| Comparative example | 1 | β-Si3N4 | SiO2, Ca(Si2O2N2) |
| Example | 2 | Crystal structure identical to that of Ca2Si5O3N6 | |
| Example | 3 | Crystal structure identical to that of Ca2Si5O3N6 | |
| Example | 4 | Crystal structure identical to that of Ca2Si5O3N6 | |
| Example | 5 | Crystal structure identical to that of Ca2Si5O3N6 | |
| Example | 6 | Crystal structure identical to that of Ca2Si5O3N6 | |
| Example | 7 | Crystal structure identical to that of Ca2Si5O3N6 | |
| Example | 8 | Crystal structure identical to that of Ca2Si5O3N6 | |
| Example | 9 | Crystal structure identical to that of Ca2Si5O3N6 | |
| Example | 10 | Crystal structure identical to that of Ca2Si5O3N6 | |
| Example | 11 | Crystal structure identical to that of Ca2Si5O3N6 | |
| Example | 12 | Crystal structure identical to that of Ca2Si5O3N6 | β-Si3N4 |
| Example | 13 | Crystal structure identical to that of Ca2Si5O3N6 | |
| Example | 14 | Crystal structure identical to that of Ca2Si5O3N6 | |
| Example | 15 | Crystal structure identical to that of Ca2Si5O3N6 | |
| Example | 16 | Crystal structure identical to that of Ca2Si5O3N6 | |
| Example | 17 | Crystal structure identical to that of Ca2Si5O3N6 | |
| Example | 18 | Crystal structure identical to that of Ca2Si5O3N6 | |

TABLE 6-continued

Main Formation Phases in Examples and Comparative Example

| Example | | Main phase | Sub phase |
|---|---|---|---|
| Example | 19 | Crystal structure identical to that of Ca2Si5O3N6 | |
| Example | 20 | Crystal structure identical to that of Ca2Si5O3N6 | |
| Example | 21 | Crystal structure identical to that of Ca2Si5O3N6 | |
| Example | 22 | Crystal structure identical to that of Ca2Si5O3N6 | |
| Example | 23 | Crystal structure identical to that of Ca2Si5O3N6 | |
| Example | 25 | Crystal structure identical to that of Ca2Si5O3N6 | |
| Example | 26 | Crystal structure identical to that of Ca2Si5O3N6 | |
| Example | 27 | Crystal structure identical to that of Ca2Si5O3N6 | |
| Example | 29 | Crystal structure identical to that of Ca2Si5O3N6 | |
| Example | 30 | Crystal structure identical to that of Ca2Si5O3N6 | |
| Example | 31 | Crystal structure identical to that of Ca2Si5O3N6 | |
| Example | 32 | Crystal structure identical to that of Ca2Si5O3N6 | |
| Example | 33 | Crystal structure identical to that of Ca2Si5O3N6 | |
| Example | 34 | Crystal structure identical to that of Ca2Si5O3N6 | |
| Example | 35 | Crystal structure identical to that of Ca2Si5O3N6 | |
| Example | 36 | Crystal structure identical to that of Ca2Si5O3N6 | |
| Example | 37 | Crystal structure identical to that of Ca2Si5O3N6 | |
| Example | 39 | Crystal structure identical to that of Ca2Si5O3N6 | |
| Example | 40 | Crystal structure identical to that of Ca2Si5O3N6 | |
| Example | 41 | Crystal structure identical to that of Ca2Si5O3N6 | |
| Example | 42 | Crystal structure identical to that of Ca2Si5O3N6 | |
| Example | 44 | Crystal structure identical to that of Ca2Si5O3N6 | |
| Example | 45 | Crystal structure identical to that of Ca2Si5O3N6 | |
| Example | 46 | Crystal structure identical to that of Ca2Si5O3N6 | |
| Example | 47 | Crystal structure identical to that of Ca2Si5O3N6 | |
| Example | 48 | Crystal structure identical to that of Ca2Si5O3N6 | |
| Example | 49 | Crystal structure identical to that of Ca2Si5O3N6 | |
| Example | 50 | Crystal structure identical to that of Ca2Si5O3N6 | |
| Example | 51 | Crystal structure identical to that of Ca2Si5O3N6 | |
| Example | 52 | Crystal structure identical to that of Ca2Si5O3N6 | |
| Example | 53 | Crystal structure identical to that of Ca2Si5O3N6 | |
| Example | 54 | Crystal structure identical to that of Ca2Si5O3N6 | |
| Example | 55 | Crystal structure identical to that of Ca2Si5O3N6 | |
| Example | 56 | Crystal structure identical to that of Ca2Si5O3N6 | |
| Example | 57 | Crystal structure identical to that of Ca2Si5O3N6 | |
| Example | 58 | Crystal structure identical to that of Ca2Si5O3N6 | |
| Example | 59 | Crystal structure identical to that of Ca2Si5O3N6 | |
| Example | 60 | Crystal structure identical to that of Ca2Si5O3N6 | |
| Example | 61 | Crystal structure identical to that of Ca2Si5O3N6 | |
| Example | 62 | Crystal structure identical to that of Ca2Si5O3N6 | |
| Example | 63 | Crystal structure identical to that of Ca2Si5O3N6 | |
| Example | 64 | Crystal structure identical to that of Ca2Si5O3N6 | |
| Example | 65 | Crystal structure identical to that of Ca2Si5O3N6 | |
| Example | 66 | Crystal structure identical to that of Ca2Si5O3N6 | |
| Example | 67 | Crystal structure identical to that of Ca2Si5O3N6 | |

As shown in Table 6, it was confirmed that the synthesized compounds of the examples according to the present invention had, as the main formation phase, at least 20 mass % of phase having the same crystal structure as the $Ca_2Si_5O_3N_6$ crystal. The difference between the mixed raw material composition and the chemical composition of the synthesized compound suggests that a slight amount of impurity second phase was mixed in the synthesized compound.

From the aforementioned, it was confirmed that the synthesized compounds of examples according to the present invention included an inorganic compound as a main component comprising the $Ca_2Si_5O_3N_6$ system crystal into which the activating ion M such as Eu was solid-solved.

After firing, the thus-obtained synthesized compound (sintered body) was crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

As a result of irradiating light of wavelength of 365 nm emitted by the lamp onto these powder samples, it was confirmed that these powder samples emitted light of blue-to-orange color. Emission spectra and excitation spectra of these powders were measured using a spectrophotofluorometer. Parts of the results are shown in FIGS. 6 to 9. Peak wavelengths of the excitation spectra and peak wavelengths of the emission spectra are shown in Table 7.

Figure 6:
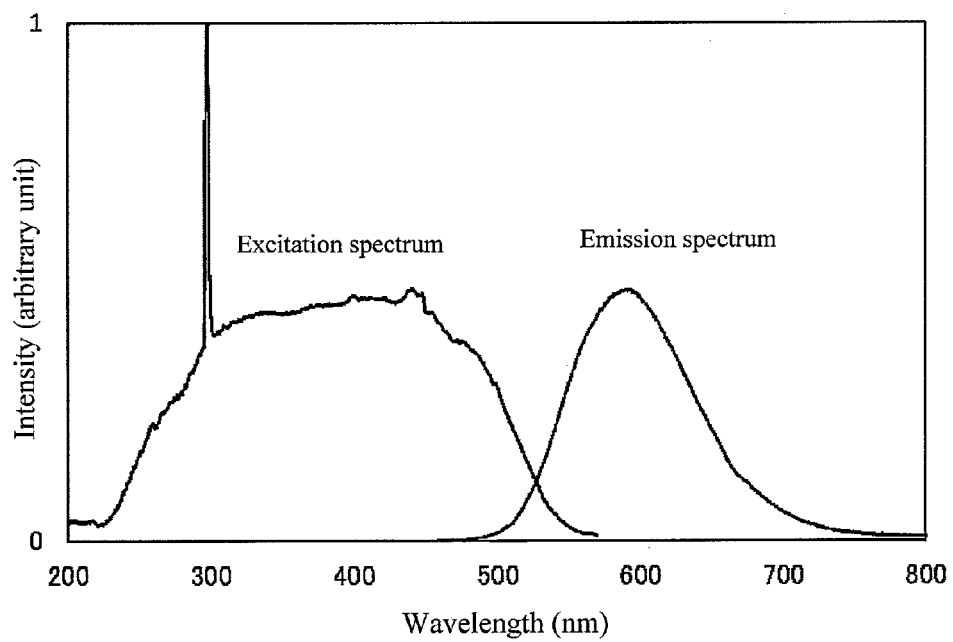
FIG. 6 is a diagram showing an excitation spectrum and an emission spectrum of a synthesized compound in Example 23.

FIG. 6 is a diagram showing an excitation spectrum and an emission spectrum of a synthesized compound in Example 23.

Figure 7:
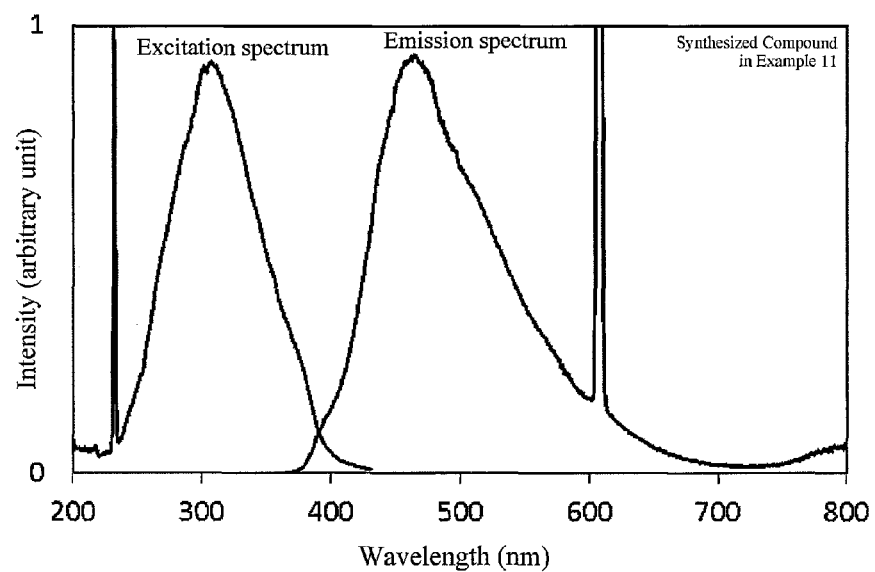
FIG. 7 is a diagram showing an excitation spectrum and an emission spectrum of a synthesized compound in Example 11.

FIG. 7 is a diagram showing an excitation spectrum and an emission spectrum of a synthesized compound in Example 11.

Figure 8:
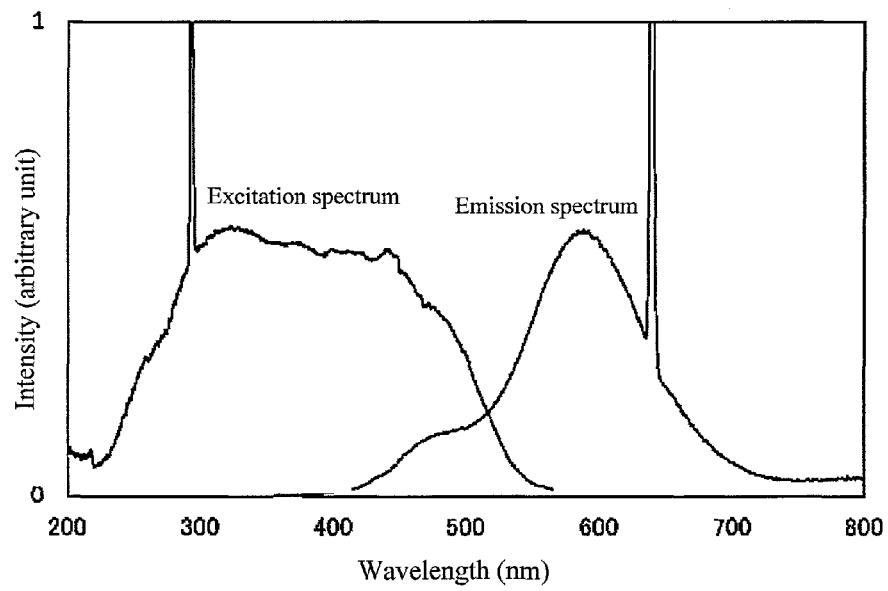
FIG. 8 is a diagram showing an excitation spectrum and an emission spectrum of a synthesized compound in Example 45.

FIG. 8 is a diagram showing an excitation spectrum and an emission spectrum of a synthesized compound in Example 45.

Figure 9:
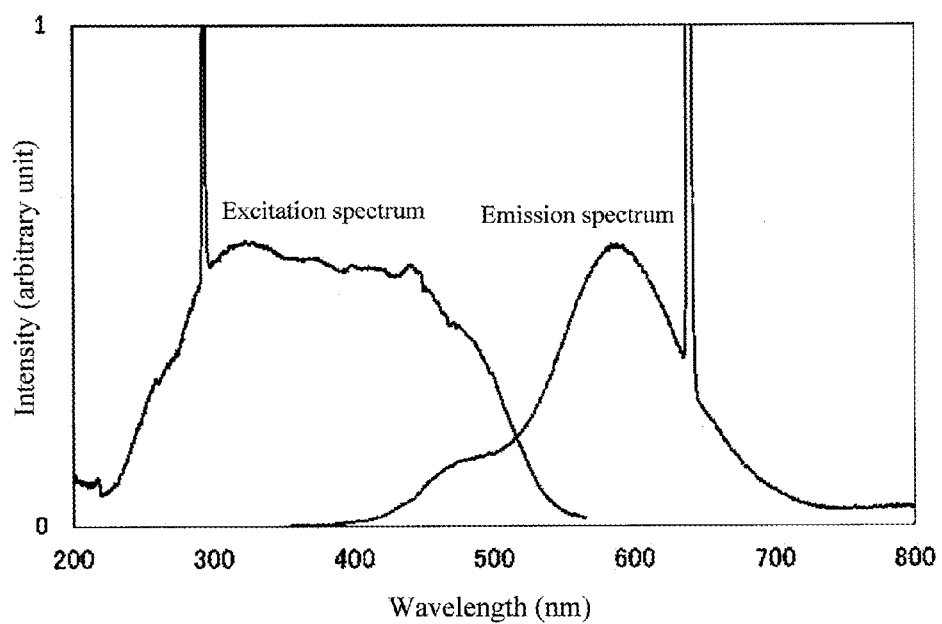
FIG. 9 is a diagram showing an excitation spectrum and an emission spectrum of a synthesized compound in Example 60.

FIG. 9 is a diagram showing an excitation spectrum and an emission spectrum of a synthesized compound in Example 60.

TABLE 7

Excitation Emission Characteristics in Examples and Comparative Examples

| Example | | Excitation peak wavelength (nm) | Emission peak wavelength (nm) | Emission intensity (arbitrary unit) |
|---|---|---|---|---|
| Comparative example | 1 | | | Not emitted |
| Example | 2 | 310 | 482 | 0.52 |
| Example | 3 | 308 | 478 | 0.57 |
| Example | 4 | 297 | 465 | 0.52 |
| Example | 5 | 299 | 471 | 0.38 |
| Example | 6 | 294 | 463 | 0.59 |
| Example | 7 | 299 | 467 | 0.58 |
| Example | 8 | 297 | 465 | 0.58 |
| Example | 9 | 293 | 461 | 0.72 |
| Example | 10 | 292 | 462 | 0.66 |
| Example | 11 | 308 | 466 | 0.93 |
| Example | 12 | 310 | 478 | 0.56 |
| Example | 13 | 308 | 477 | 0.59 |
| Example | 14 | 295 | 466 | 0.67 |
| Example | 15 | 292 | 467 | 0.38 |
| Example | 16 | 300 | 462 | 0.64 |
| Example | 17 | 292 | 466 | 0.63 |
| Example | 18 | 294 | 464 | 0.59 |
| Example | 19 | 290 | 461 | 0.69 |
| Example | 20 | 295 | 461 | 0.67 |
| Example | 21 | 305 | 459 | 0.72 |
| Example | 22 | 342 | 580 | 0.48 |
| Example | 23 | 441 | 592 | 0.49 |
| Comparative example | 24 | | | Not emitted |
| Example | 25 | 334 | 587 | 0.38 |
| Example | 26 | 441 | 586 | 0.42 |
| Example | 27 | 440 | 585 | 0.41 |
| Comparative example | 28 | | | Not emitted |
| Example | 29 | 326 | 579 | 0.37 |
| Example | 30 | 324 | 578 | 0.44 |
| Example | 31 | 440 | 588 | 0.37 |
| Example | 32 | 441 | 591 | 0.35 |
| Example | 33 | 443 | 594 | 0.39 |
| Example | 34 | 481 | 606 | 0.14 |
| Example | 35 | 365 | 590 | 0.9 |
| Example | 36 | 448 | 603 | 0.75 |
| Example | 37 | 445 | 602 | 0.11 |
| Comparative example | 38 | | | Not emitted |
| Example | 39 | 440 | 599 | 0.43 |
| Example | 40 | 442 | 606 | 0.51 |
| Example | 41 | 440 | 605 | 0.75 |
| Example | 42 | 448 | 604 | 0.17 |
| Comparative example | 43 | | | Not emitted |
| Example | 44 | 439 | 584 | 0.74 |
| Example | 45 | 448 | 590 | 0.80 |
| Example | 46 | 326 | 590 | 0.79 |
| Example | 47 | 320 | 597 | 0.93 |
| Example | 48 | 317 | 600 | 0.92 |
| Example | 49 | 441 | 613 | 1.00 |
| Example | 50 | 448 | 598 | 0.73 |
| Example | 51 | 447 | 602 | 0.72 |
| Example | 52 | 412 | 585 | 0.47 |
| Example | 53 | 335 | 585 | 0.47 |
| Example | 54 | 324 | 589 | 0.62 |
| Example | 55 | 440 | 587 | 0.45 |
| Example | 56 | 328 | 591 | 0.51 |
| Example | 57 | 324 | 590 | 0.71 |
| Example | 58 | 332 | 588 | 0.40 |
| Example | 59 | 328 | 589 | 0.45 |
| Example | 60 | 324 | 587 | 0.56 |
| Example | 61 | 441 | 589 | 0.44 |
| Example | 62 | 331 | 591 | 0.46 |
| Example | 63 | 325 | 592 | 0.64 |
| Example | 64 | 316 | 592 | 0.78 |
| Example | 65 | 318 | 591 | 0.53 |
| Example | 66 | 326 | 590 | 1.01 |
| Example | 67 | 330 | 592 | 0.71 |

With reference to FIG. 6, it was found that the synthesized compound of Example 23 could have been excited at 441 nm most efficiently and that the emission spectrum upon excitation of 441 nm had a peak at 592 nm and was yellow. It was confirmed that an emission color of the synthesized compound of Example 23 was within the following range: $0 \leq x \leq 0.7$ and $0 \leq y \leq 0.9$ in the CIE 1931 chromaticity coordinates.

According to FIG. 7, it was found that the synthesized compound of Example 11 could be excited at 308 nm most efficiently and that the emission spectrum upon excitation of 308 nm had a peak at 466 nm and was blue. It was also confirmed that an emission color of the synthesized compound of Example 11 was within the following range: $0 \leq x \leq 0.7$ and $0 \leq y \leq 0.9$ in the CIE 1931 chromaticity coordinates.

According to FIG. 8, it was found that the synthesized compound of Example 45 could be excited at 448 nm most efficiently and that the emission spectrum upon excitation of 448 nm had a peak at 590 nm and was yellow. It was also confirmed that an emission color of the synthesized compound of Example 46 was within the following range: $0 \leq x \leq 0.7$ and $0 \leq y \leq 0.9$ in the CIE 1931 chromaticity coordinates.

According to FIG. 9, the synthesized compound of Example 60 could be excited at 324 nm most efficiently and that the emission spectrum upon excitation of 324 nm had a peak at 587 nm and was yellow. It was also confirmed that an emission color of the synthesized compound of Example 61 was within the following range: $0 \leq x \leq 0.7$ and $0 \leq y \leq 0.9$ in the CIE 1931 chromaticity coordinates.

According to Table 7, it was confirmed that the synthesized compounds of the present invention could be excited by an ultraviolet ray of 290 nm to 380 nm and violet or blue light of 380 nm to 500 nm and were phosphors to emit blue-to-orange light.

From the aforementioned, it was found that the synthesized compounds of examples according to the present invention included an inorganic compound as a main component comprising the $Ca_2Si_5O_3N_6$ system crystal into which the activating ion M such as Eu was solid-solved and that the inorganic compound was a phosphor.

Further, according to Tables 3 and 7, it should be understood that a phosphor exhibiting blue-to-orange color emission can be obtained by controlling the composition to a specific composition.

For example, as shown with respect to the synthesized compounds of Examples 22-67, a phosphor including an inorganic compound comprising a crystal in which Eu is solid-solved as the M element emits yellow-to-orange light having a peak at the wavelength in the range of at least 570 nm and not exceeding 615 nm, wherein the crystal is characterized in that the A element is at least one element selected from the group consisting of Ca, Ba, and Sr; the E element is Al if necessary; the D element is Si; and the X element is a combination of N and O. More specifically, these synthesized compounds were inorganic compounds represented by a composition formula of $M_dA_eD_fE_gX_h$ (where M was Eu, the A element was at least one element selected from the group consisting Ca, Ba, and Sr, the E element was Al if necessary, the D element was Si, the X element was a combination of N and O, and $d+e+f+g+h=1$) wherein d satisfied $0.003 \leq d \leq 0.04$.

Further, more specifically, according to Examples 35-37, it was found that the inorganic compound became a yellow phosphor to emit light of high brightness if the parameter d satisfying $d \leq 0.035$. According to the synthesized compounds of Examples 22-27 and 29-34, it was found that the inorganic compound became a yellow phosphor to emit light of high brightness by excitation spectrum having a peak wavelength of at least 400 nm (in the examples, at least 440 nm) and, in particular, excitation of visible light of the wavelength of at least 400 nm and not exceeding 500 nm if the parameter d satisfying 0.006≤d≤0.035, wherein the M element was Eu and the A element was a combination of Ca and Ba.

Further, more specifically, it was found that the synthesized compounds of Examples 22-67 were inorganic compounds represented by $Eu_yCa_{2-y}Si_{5-x}Al_xO_{3+x}N_{6-x}$, $Eu_y(Ca, Ba)_{2-y}Si_{5-x}Al_xO_{3+x}N_{6-x}$ wherein both Ca and Ba are present, $Eu_y(Ca, Sr)_{2-y}Si_{5-x}Al_xO_{3+x}N_{6-x}$ wherein both Ca and Sr are present, or $Eu_y(Ca, Ba, Sr)_{2-y}Si_{5-x}Al_xO_{3+x}N_{6-x}$, wherein at least one of Ca, Ba, and Sr is present, wherein y satisfied 0.05≤y≤0.7 and that the inorganic compound satisfying 0.05≤y≤0.5 was a yellow phosphor to emit light of high brightness.

In particular, according to Examples 22-34, it was shown that the inorganic compound represented by $Eu_y(Ca,Ba)_{2-y}Si_{5-x}Al_xO_{3+x}N_{6-x}$ wherein both Ca and Ba are present (where 0.1≤y≤0.5) was characterized in the excitation spectrum had the wavelength of at least 400 nm and suitable for a yellow phosphor with excitation by visible light utilizing a blue LED or the like.

For example, as shown with the synthesized compounds of Examples 2-21, a phosphor including an inorganic compound comprising a crystal in which Eu as the M element is solid solved emits blue light having a peak at the wavelength in the range of at least 450 nm and not exceeding 490 nm, wherein the A element is at least one element selected from the group consisting of Ca, Ba, and Sr; the E element is Al if necessary; the D element is Si; and the X element is a combination of N and O. More specifically, these synthesized compounds were inorganic compounds represented by a composition formula of $M_dA_eD_fE_gX_h$ (where M was Eu, the A element was at least one element selected from the group consisting Ca, Ba, and Sr; the E element was Al if necessary; the D element was Si; the X element was a combination of N and O; and d+e+f+g+h=1) wherein d satisfied 0.0001≤d≤0.001. Further, more specifically, these synthesized compounds were inorganic compounds represented by $Eu_yCa_{2-y}Si_{5-x}Al_xO_{3+x}N_{6-x}$, $Eu_y(Ca, Ba)_{2-y}Si_{5-x}Al_xO_{3+x}N_{6-x}$ wherein both Ca and Ba are present, or $Eu_y(Ca, Sr)_{2-y}Si_{5-x}Al_xO_{3+x}N_{6-x}$ wherein both Ca and Sr are present, wherein the parameter y satisfied 0.002≤y≤0.015.

According to Examples 35-37, it was shown that the phosphor including an inorganic compound as a main component was obtained wherein the inorganic compound comprised a crystal represented by $Ca_2Si_5O_3N_6$ in which Eu as the M element was solid solved as an inorganic crystal having the crystal structure identical to that of the crystal represented by $Ca_2Si_5O_3N_6$.

According to Examples 22-63, it was shown that the phosphor including an inorganic compound as a main component could be obtained wherein the inorganic compound comprised $(Ca, Ba)_2Si_5O_3N_6$, $(Ca, Sr)_2Si_5O_3N_6$, and $(Ca, Ba, Sr)_2Si_5O_3N_6$ in which Eu as the M element was solid solved as an inorganic crystal having the crystal structure identical to that of the crystal represented by $Ca_2Si_5O_3N_6$.

Further, according to Examples 9-12, 19-21, and 63-67, it was shown that the phosphor including an inorganic compound as a main component could be obtained wherein the inorganic compound comprised $(Ca, Ba)_2Si_{5-x}Al_xO_{3+x}N_{6-x}$ and $(Ca, Sr)_2Si_{5-x}Al_xO_{3+x}N_{6-x}$ (where 0≤x≤4, preferably 0≤x≤1) in which Eu as the M element was solid solved as an inorganic crystal having the crystal structure identical to that of the crystal represented by $Ca_2Si_5O_3N_6$. According to Examples 35-37, because the A element is only Ca, a phosphor including an inorganic compound as a main component is also suggested wherein the inorganic compound comprises $Ca_2Si_{5-x}Al_xO_{3+x}N_{6-x}$ (where 0≤x≤4) in which the M element is solid solved. Likewise, according to Examples 52-63, because the A element of Ca is partially substituted by Ba and Sr, a phosphor including an inorganic compound as a main component is also suggested wherein the inorganic compound comprises $(Ca, Ba, Sr)_2Si_{5-x}Al_xO_{3+x}N_{6-x}$ (where 0≤x≤4) in which the M element is solid solved.

Figure 10:
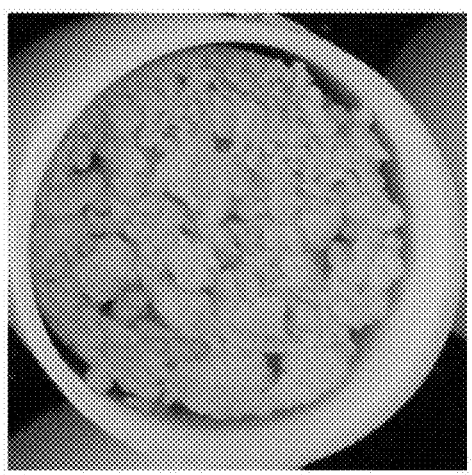
FIG. 10 is a diagram showing an object color of a synthesized compound in Example 23.

FIG. 10 is a diagram showing an object color of a synthesized compound in Example 23.

Figure 11:
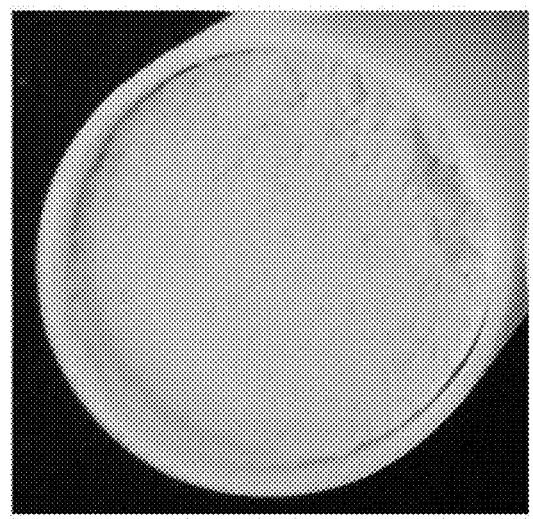
FIG. 11 is a diagram showing an object color of a synthesized compound in Example 8.

FIG. 11 is a diagram showing an object color of a synthesized compound in Example 8.

As shown in FIGS. 10 and 11, it was confirmed that the synthesized compounds obtained in Examples 23 and 8 had a yellow color and a white color as the object color, respectively, and were excellent in colloring. Although not shown in the figure, synthesized compounds of other Examples also exhibited a yellow color or a white color as the object color.

From the aforementioned, the emission characteristics of the above-described examples are summarized as follows: it is said that blue phophors could be provided in Examples 2-21; yellow phosphors including Ca and Ba could be provided in Examples 22-34; yellow phosphors including Ca could be provided in Examples 35-37; yellow phosphors including Ca and Sr could be provided in Examples 39-51; yellow phosphors including Ca, Ba, and Sr could be provided in Examples 52-63; and yellow phosphors including Ca, Sr, and Al could be provided in Examples 64-67. Further, the inorganic compounds of the synthesized compounds according to the present invention exhibited the object color of white by irradiation of the sunlight or an illumination such as a fluorescent lamp so that it was found that they could be utilized for the pigment or the fluorescent pigment.

Examples of Light-Emitting Device and Image Display Device; Examples 68 to 71

A light-emitting device utilizing the phosphor of the present invention will be described.

Example 68

Figure 12:
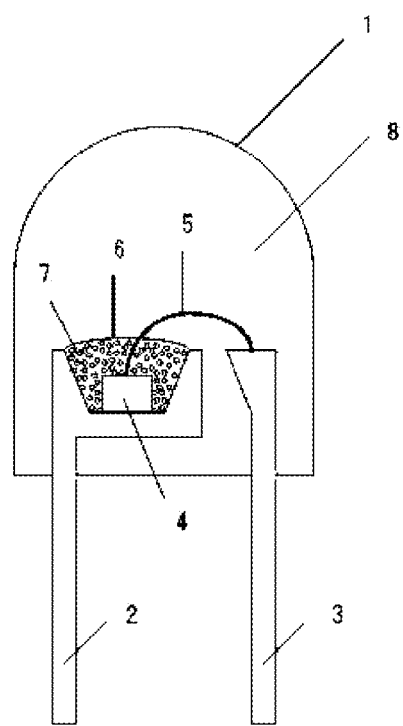
FIG. 12 is a schematic diagram showing an illuminating device (bullet-type of LED illuminating device) according to the present invention.

FIG. 12 is a schematic diagram showing an illuminating device (bullet-type of LED illuminating device) according to the present invention.

A so-called bullet-type white light-emitting diode lamp (1) shown in FIG. 12 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the ultraviolet light-emitting diode element (4). The first resin (6) in which this phosphor is dispersed is transparent, and covers the entire ultraviolet light-emitting diode element (4). The tip-top portion of the lead wire including the recess, the ultraviolet light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the yellow phosphor prepared for Example 30 and the blue phosphor of JEM:Ce were mixed at the mass ratio of 7:3 to make a phosphor powder, which was further mixed into epoxy resin at the concentration of 37 wt %, and this resultant mixture was dropped in an appropriate amount with a dispenser such that the first resin (6) was formed in which phosphor-mixed droplets (7) were dispersed. The light emitted by the thus-obtained light-emitting device had an emission color of white and characterized by x=0.33 and y=0.33 in the color coordinates.

Example 69

Figure 13:
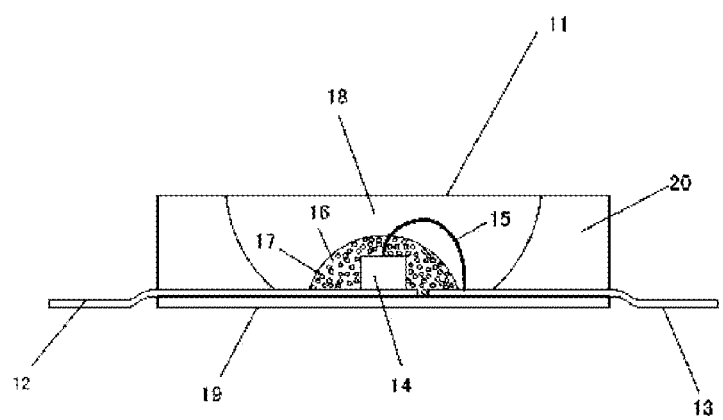
FIG. 13 is a schematic diagram showing an illuminating device (board-mounting-type LED illuminating device) according to the present invention.

FIG. 13 is a schematic diagram showing an illuminating device (board-mounting-type LED illuminating device) according to the present invention.

A chip-type white light-emitting diode lamp (11) for board-mounting as shown in FIG. 13 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected with a bonding wire (15) of a gold thin wire.

A material prepared by mixing the first resin (16) and a blended phosphor (17) prepared by blending the yellow phosphor prepared for Example 36 and a red phosphor of CaAlSiN$_3$:Eu with the mass ratio of 9:1 is mounted in the vicinity of the light-emitting diode element. The first resin in which this phosphor is dispersed is transparent, and covers the entire blue light-emitting diode element (14).

Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The percentage of phosphor addition, the attained chromaticity, and the like are approximately identical to those in Example 68.

An example of design of an image display device using the phosphor of the present invention is described.

Example 70

Figure 14:
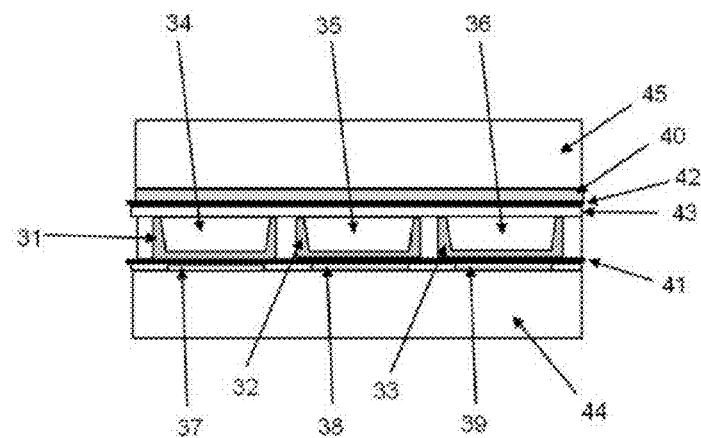
FIG. 14 is a schematic diagram showing an image display device (plasma display panel) according to the present invention.

FIG. 14 is a schematic diagram showing an image display device (plasma display panel) according to the present invention.

A red phosphor (CaAlSiN$_3$:Eu$^{2+}$) (31), a green phosphor (β-sialon:Eu$^{2+}$) (32), and a blue phosphor (33) of Example 11 of the present invention are applied to inner surfaces of the respective cells (34, 35, 36), which are arranged via electrodes (37, 38, 39) and a dielectric layer (41) over a glass substrate (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display device.

Example 72

Figure 15:
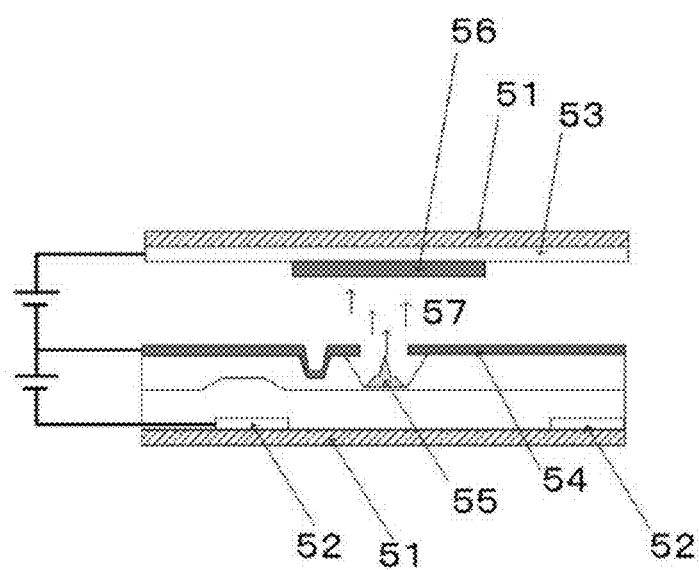
FIG. 15 is a schematic diagram showing an image display device (field emission display panel) according to the present invention.

FIG. 15 is a schematic diagram showing an image display device (field emission display panel) according to the present invention.

The blue phosphor (56) of Example 11 of the present invention is applied to an interior surface of an anode (53). By applying a voltage between a cathode (52) and a gate (54), electrons (57) are emitted from an emitter (55). The electrons are accelerated by the voltage between the anode (53) and cathode (52), and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a green color in addition to for a blue color. Although the phosphors to be used for cells for a green color and a red color are not particularly specified, a phosphor which exhibits high brightness under a low speed electron beam is preferable.

INDUSTRIAL APPLICABILITY

The phosphor of the present invention exhibits high emission intensity in the case where it is combined with a LED of 470 nm or less, is chemically and thermally stable, and further has little degradation in the intensity of the phosphor when it is exposed to the excitation source for a long period of time such that it is a phosphor to be used suitably for the VFD, the FED, the PDP, the CRT, and the white LED. It is expected that the phosphor of the present invention will be utilized in material design in various kinds of display devices so as to contribute to the development of the industry.

EXPLANATION OF NUMERALS 1 bullet-type light-emitting diode lamp.
2, 3 lead wire.
4 light-emitting diode element.
5 bonding wire.
6, 8 resin.

7 phosphor.
11 chip-type white light-emitting diode lamp for board-mounting.
12, 13 lead wire.
14 light-emitting diode element.
15 bonding wire.
16, 18 resin.
17 phosphor.
19 alumina ceramic board.
20 wall surface member.
31 red phosphor.
32 green phosphor.
33 blue phosphor.
34, 35, 36 ultraviolet ray emission cell.
37, 38, 39, 40 electrode.
41, 42 dielectric layer.
43 protective layer.
44, 45 glass substrate.
51 glass.
52 cathode.
53 anode.
54 gate.
55 emitter.
56 phosphor.
57 electrons.

What is claimed is:

1. A phosphor comprising: an inorganic compound comprising:
an inorganic crystal having a same crystal structure as a crystal represented by $Ca_2Si_5O_3N_6$, which includes an A element, a D element, and an X element, and an E element if necessary wherein A is one or more kinds of elements selected from the group consisting of Mg, Ca, Sr, and Ba; D is one or more kinds of elements selected from the group consisting of Si, Ge, Sn, Ti, Zr, and Hf; E is one or more kinds of elements selected from the group consisting of B, Al, Ga, In, Sc, Y, and La; and X is one or more kinds of elements selected from the group consisting of O, N, and F, in which an M element is solid solved wherein M is one or more kinds of elements selected from the group consisting of Mn, Ce, Pr, Nd, Sm, Eu, Tb, Dy, and Yb, and which includes the crystal itself represented by $Ca_2Si_5O_3N_6$ or a solid solution thereof in which one or more kinds of elements selected from the group consisting of Mg, Sr, Ba, Ge, Sn, Ti, Zr, Hf, B, Al, Ga, In, Sc, Y, La, and F are solid solved and
wherein the inorganic crystal is a crystal in a monoclinic system and is represented by $A_2(D, E)_5X_9$ wherein at least D of D and E is present.

2. The phosphor according to claim 1,
wherein the inorganic crystal has a symmetry in a space group Cm, and lattice constants a, b, and c have values in following ranges:
a=0.70588±0.05 nm;
b=2.37480±0.05 nm; and
c=0.96341±0.05 nm.

3. The phosphor according to claim 1, wherein:
the A element is at least one element selected from the group consisting of Ca, Ba, and Sr;
the D element is Si; and
the X element is 0 and N.

4. The phosphor according to claim 1,
wherein the inorganic crystal is represented by a composition formula of $Ca_2Si_{5-x}Al_xO_{3+x}N_{6-x}$, $(Ca, Ba)_2Si_{5-x}Al_xO_{3+x}N_{6-x}$ wherein both Ca and Ba are present, $(Ca,Sr)_2Si_{5-x}Al_xO_{3+x}N_{6-x}$ wherein both Ca and Sr are present, or $(Ca,Ba,Sr)_2Si_{5-x}Al_xO_{3+x}N_{6-x}$ wherein at least one of Ca, Ba, and Sr is present (where $0 \le x \le 4$).

5. The phosphor according to claim 1,
wherein the M element is Eu.

6. The phosphor according to claim 5,
wherein the inorganic compound is represented by a composition formula of $M_dA_eD_fE_gX_h$ comprising the M element, the A element, the D element, the E element, and the X element (where d+e+f+g+h=1 in the formula); and parameters d, e, f, g, and h satisfy following conditions:
$0.00001 \le d \le 0.05$,
$0.08 \le e \le 0.15$,
$0.2 \le f \le 0.4$,
$0 \le g \le 0.05$, and
$0.45 \le h \le 0.65$.

7. The phosphor according to claim 6,
wherein the parameters f and g satisfy a condition of:
$4/5 \le f/(f+g) \le 1$.

8. The phosphor according to claim 6,
wherein the parameter d satisfies a condition of:
$0.01 \le d$,
the A element is Ca, a mixture of Ca and Sr, a mixture of Ca and Ba, or a mixture of Ca, Sr, and Ba; and the D element is Si; and the X element is a mixture of O and N, and
fluorescence of yellow-to-orange color having a peak in a wavelength range from 570 nm to 615 nm is emitted.

9. The phosphor according to claim 1,
wherein a color of light emitted upon irradiation of an excitation source satisfies, in terms of values of (x, y) of CIE 1931 chromaticity coordinates, conditions:
$0 \le x \le 0.7$; and
$0 \le y \le 0.9$.

10. A method of manufacturing a phosphor recited in claim 1 comprising:
firing a mixture of metal compounds in a temperature range of at least 1,200° C. and not exceeding 2,200° C. in an inert atmosphere including nitrogen,
wherein the mixture of metal compounds can constitute an inorganic compound comprising:
an inorganic crystal having a same crystal structure as a crystal represented by $Ca_2Si_5O_3N_6$, which includes an A element, a D element, and an X element, and an E element if necessary wherein A is one or more kinds of elements selected from the group consisting of Mg, Ca, Sr, and Ba; D is one or more kinds of elements selected from the group consisting of Si, Ge, Sn, Ti, Zr, and Hf; E is one or more kinds of elements selected from the group consisting of B, Al, Ga, In, Sc, Y, and La; and X is one or more kinds of elements selected from the group consisting of O, N, and F in which an M element is solid solved wherein M is one or more kinds of elements selected from the group consisting of Mn, Ce, Pr, Nd, Sm, Eu, Tb, Dy, and Yb, and which includes the crystal itself represented by $Ca_2Si_5O_3N_6$ or a solid solution thereof in which one or more kinds of elements selected from the group consisting of Mg, Sr, Ba, Ge, Sn, Ti, Zr, Hf, B, Al, Ga, In, Sc, Y, La, and F are solid solved and
wherein the inorganic crystal is represented by $A_2(D, E)_5X_9$ wherein at least D of D and E is present.

11. A light-emitting device comprising
at least a light-emitting body or an emission source and a first phosphor, wherein the first phosphor includes at least a phosphor recited in claim 1.

12. The light-emitting device according to claim 11, wherein the light-emitting body emits light in a wavelength of 330 to 500 nm and is selected from an organic EL light-emitting body (OLED), a semiconductor laser, a laser diode (LD), or a light-emitting diode (LED).

13. The light-emitting device according to claim 11, wherein the light-emitting device is a white light-emitting diode, an illuminating device including a plurality of white light-emitting diodes, or a backlight for a liquid crystal panel.

14. The light-emitting device according to claim 11, wherein the light-emitting body or the emission source emits ultraviolet or visible light having a peak wavelength of 280 to 500 nm, and
wherein the light-emitting device emits white light or light other than the white light by mixing blue-to-orange light emitted by the first phosphor and light having a wavelength of 450 nm or more emitted by another phosphor.

15. The light-emitting device according to claim 11, further comprising
a blue phosphor being caused to emit light having a peak wavelength of 420 nm to 500 nm or less by the light-emitting body or the emission source.

16. The light-emitting device according to claim 15, wherein the blue phosphor is selected from a group consisting of AlN:(Eu, Si) wherein both Eu and Si are present, $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

17. The light-emitting device according to claim 11, further comprising a green phosphor being caused to emit light having a peak wavelength of at least 500 nm and not exceeding 550 nm by the light-emitting body or the emission source.

18. The light-emitting device according to claim 17, wherein the green phosphor is selected from a group consisting of β-sialon:Eu, $(Ba,Sr,Ca,Mg)_2SiO_4$:Eu wherein at least one of Ba, Sr, Ca, and Mg is present, and $(Ca,Sr,Ba)Si_2O_2N_2$:Eu wherein at least one of Ca, Sr, and Ba is present.

19. The light-emitting device according to claim 11, further comprising
a yellow phosphor being caused to emit light having a peak wavelength of at least 550 nm and not exceeding 600 by the light-emitting body or the emission source.

20. The light-emitting device according to claim 19, wherein the yellow phosphor is selected from a group consisting of YAG: Ce, α-sialon:Eu, $CaAlSiN_3$:Ce, and $La_3Si_6N_{11}$:Ce.

21. The light-emitting device according to claim 11, further comprising a red phosphor being caused to emit light having a peak wavelength of at least 600 nm and not exceeding 700 nm by the light-emitting body or the emission source.

22. The light-emitting device according to claim 21, wherein the red phosphor is selected from a group consisting of $CaAlSiN_3$:Eu, (Ca, Sr)$AlSiN_3$:Eu wherein both Ca and Sr are present, $Ca_2Si_5N_8$:Eu, and $Sr_2Si_5N_8$:Eu.

23. The light-emitting device according to claim 11, wherein the light-emitting body or the emission source is an LED for emitting light having a wavelength of 320 to 450 nm.

24. An image display device comprising
an excitation source and a first phosphor,
wherein the first phosphor includes at least a phosphor recited in claim 1.

25. The image display device according to claim 24, wherein the image display device is a fluorescent display tube (VFD), a field emission display (FED), a plasma display panel (PDP), a cathode-ray tube (CRT), or a liquid crystal display (LCD).

26. A pigment comprising an inorganic compound recited in claim 1.

27. An ultraviolet absorber comprising an inorganic compound recited in claim 1.

* * * * *